(12) United States Patent
Lee et al.

(10) Patent No.: US 7,886,108 B2
(45) Date of Patent: Feb. 8, 2011

(54) METHODS AND SYSTEMS OF MANAGING MEMORY ADDRESSES IN A LARGE CAPACITY MULTI-LEVEL CELL (MLC) BASED FLASH MEMORY DEVICE

(75) Inventors: Charles C. Lee, Cupertino, CA (US); I-Kang Yu, Palo Alto, CA (US); David Nguyen, San Jose, CA (US); Abraham Chih-Kang Ma, Fremont, CA (US); Ming-Shiang Shen, Taipei Hsien (TW)

(73) Assignee: Super Talent Electronics, Inc., San Jose, CA (US)

( * ) Notice: Subject to any disclaimer, the term of this patent is extended or adjusted under 35 U.S.C. 154(b) by 435 days.

(21) Appl. No.: 12/025,706

(22) Filed: Feb. 4, 2008

(65) Prior Publication Data

US 2008/0256287 A1 Oct. 16, 2008

Related U.S. Application Data

(60) Continuation-in-part of application No. 11/871,011, filed on Oct. 11, 2007, and a continuation-in-part of application No. 11/871,627, filed on Oct. 12, 2007, and a continuation-in-part of application No. 11/737,336, filed on Apr. 19, 2007, now Pat. No. 7,333,364, and a continuation-in-part of application No. 11/674,645, filed on Feb. 13, 2007, now Pat. No. 7,620,769, and a continuation-in-part of application No. 11/742,270, filed on Apr. 30, 2007, now Pat. No. 7,660,941, and a continuation-in-part of application No. 11/864,671, filed on Sep. 28, 2007, now abandoned, which is a continuation-in-part of application No. 10/789,333, filed on Feb. 26, 2004, now Pat. No. 7,318,117, application No. 12/025,706, which is a continuation-in-part of application No. 10/882,539, filed on Jun. 30, 2004, now Pat. No. 7,394,661, and a continuation-in-part of application No. 11/624,667, filed on Jan. 18, 2007, now abandoned, which is a division of application No. 09/478,720, filed on Jan. 6, 2000, now Pat. No. 7,257,714.

(51) Int. Cl.
*G06F 13/16* (2006.01)
(52) U.S. Cl. .................. 711/103; 711/203; 711/206
(58) Field of Classification Search ............... 711/103, 711/203, 206
See application file for complete search history.

(56) References Cited

U.S. PATENT DOCUMENTS

| 5,386,527 | A  * | 1/1995 | Bosshart ............... 711/3 |
|---|---|---|---|
| 7,366,028 | B2 | 4/2008 | Kagan et al. |
| 7,376,011 | B2 | 5/2008 | Conley et al. |
| 7,386,655 | B2 | 6/2008 | Gorobets et al. |
| 7,389,397 | B2 | 6/2008 | Paley et al. |
| 7,395,384 | B2 | 7/2008 | Sinclair et al. |

* cited by examiner

*Primary Examiner*—Sanjiv Shah
*Assistant Examiner*—Jae U Yu
(74) *Attorney, Agent, or Firm*—Roger H. Chu

(57) ABSTRACT

Methods and systems of managing memory addresses in a large capacity multi-level cell based flash memory device are described. According to one aspect, a flash memory device comprises a processing unit to manage logical-to-physical address correlation using an indexing scheme. The flash memory is partitioned into N sets. Each set includes a plurality of entries (i.e., blocks). N sets of partial logical entry number to physical block number and associated page usage information (hereinafter 'PLTPPUI') are stored in the reserved area of the MLC based flash memory. Only one of the N sets is loaded to address correlation and page usage memory (ACPUM), which is a limited size random access memory (RAM). In one embodiment, static RAM (SRAM) is implemented for fast access time for the address correlation. LSA received together with the data transfer request dictates which one of the N sets of PLTPPUI is loaded into ACPUM.

17 Claims, 34 Drawing Sheets

Data structure of PLTPPUI in Reserved Area of MLC Flash Memory 420

Old physical block (PBK#1000) for storing PLTPPUI0 422

| | | | | |
|---|---|---|---|---|
| 1st Write (P0) 424a | Entry 0 | Entry 1 | ... | FF | Special Logical Address for PLTPPUI0 | 1 |
| 2nd Write (P1) 424b | Entry 0 | Entry 1 | | | |
| ⋮ | | | | | |
| nth Write (Pn) 424n | Entry 0 | Entry 1 | | | |

New physical block (PBK#1012) for storing PLTPPUI0 432

| | | | | |
|---|---|---|---|---|
| (n+1)th Write (P0) 434 | Entry 0 | Entry 1 | ... | FF | Special Logical Address for PLTPPUI0 | 2 |

*FIG. 4C*

Data Structure of the PLTPPUI Tracking Table 440

| | Physical Block Number 444 | Tracking No. (TN) 446 | Highest Page 448 |
|---|---|---|---|
| Special Logical Address for PLTPPUI0 | 1012 | 0 | 0 |
| Special Logical Address for PLTPPUI1 | 1018 | 5 | 1 |
| ⋮ | | | |
| Special Logical Address for PLTPPUIN | 1005 | 4 | 0 |

Data Structure of the WL/BB Tracking Table 450

| | Physical Block Number 454 | Tracking No. (TN) 456 | Highest Page 458 |
|---|---|---|---|
| Special Logical Address for WL/BB0 | 1023 | 1 | 5 |
| Special Logical Address for WL/BB1 | 1020 | 0 | 3 |
| ⋮ | | | |
| Special Logical Address for WL/BBn | 1021 | 3 | 7 |

{ 452 braces the middle rows }

*FIG. 4E*

Data Structure of the WL/BB Tracking Table in Reserved Area of Flash Memory 460

|  |  |  |  |  |  | 467 | 452 | 456 |
|---|---|---|---|---|---|---|---|---|
| 1st Write (P0) | BK0 (Reserved) | BK1 WL |  |  |  | BK7 BB FFFF FFEE | Special Logical Address for WL/BB1 | 1 |
| 2nd Write (P1) |  | BK1 WL old | BK3 WL new |  |  | F F |  |  |
| 3rd Write (P2) |  | BK1 WL old | BK3 WL old | BK5 WL new |  |  |  |  |
| ⋮ |  |  |  |  | BK1000 WL new |  |  |  |
| nth Write (Pn) |  |  |  |  |  |  |  |  |

|  |  |  |  |  |  |
|---|---|---|---|---|---|
| 1st Write (P0) | BK1000 WL new | BK1003 BB |  |  | Special Logical Address for WL/BB2 |
| 2nd Write (P1) | BK1000 WL old |  | BK1021 WL new |  | F F |
| ⋮ |  |  |  |  | 1 |
| nth Write (Pn) |  |  |  |  |  |

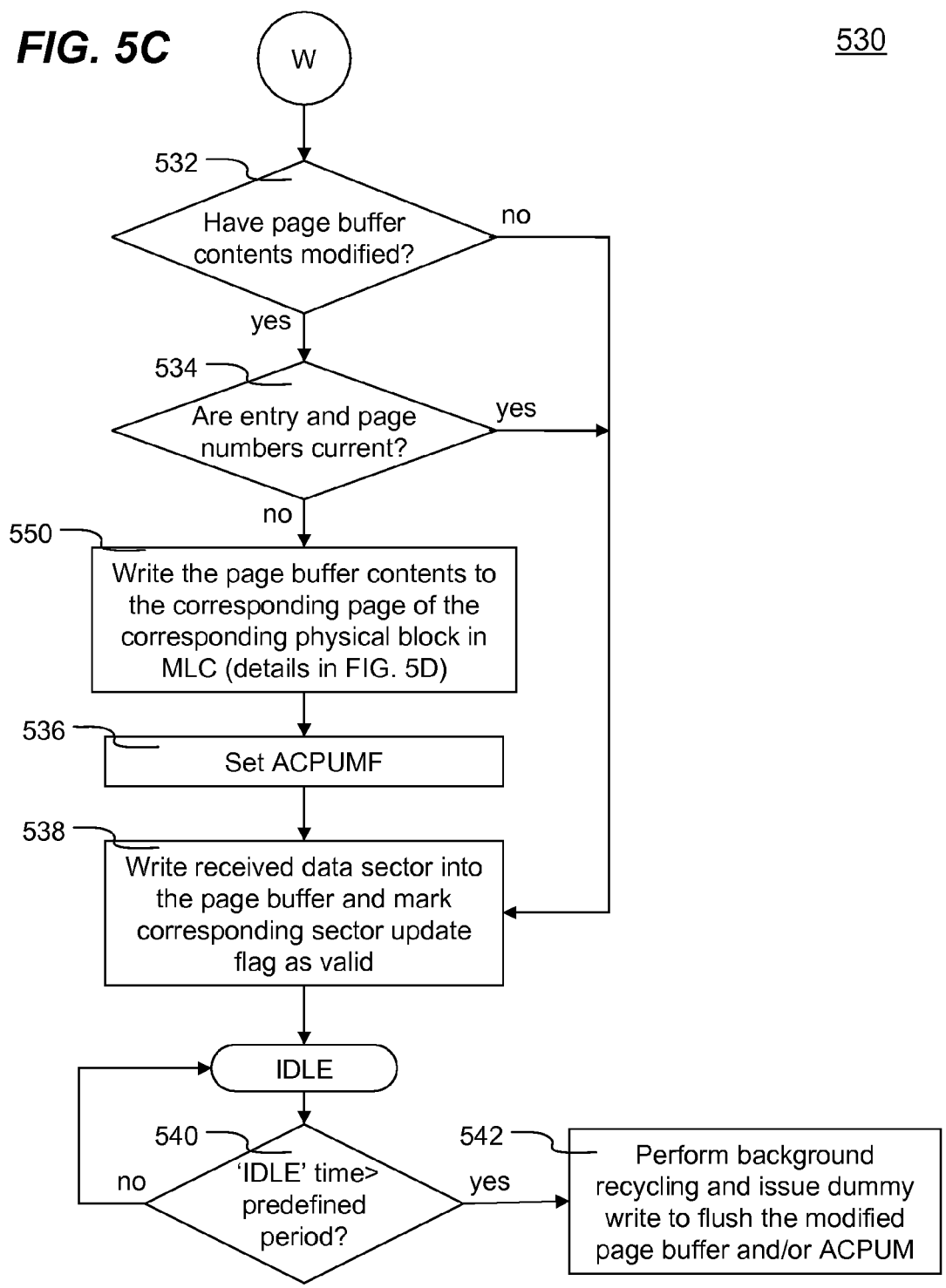

METHODS AND SYSTEMS OF MANAGING MEMORY ADDRESSES IN A LARGE CAPACITY MULTI-LEVEL CELL (MLC) BASED FLASH MEMORY DEVICE

CROSS-REFERENCE TO RELATED APPLICATIONS

This application is a continuation-in-part (CIP) of co-pending U.S. patent application for "Flash Module with Plane-Interleaved Sequential Writes to Restricted-Write Flash Chips", Ser. No. 11/871,011, filed Oct. 11, 2007, U.S. patent application for "Multi-Channel Flash Module with Plane-Interleaved Sequential ECC Writes and Background Recycling to Restricted-Write Flash Chips", Ser. No. 11/871,627, filed Oct. 12, 2007, and U.S. patent application for "Cell-Downgrading and Reference-Voltage Adjustment for A Multi-Bit-Cell Flash Memory", Ser. No. 11/737,336, filed on Apr. 19, 2007 now U.S. Pat. No. 7,333,364.

This application is also a CIP of U.S. patent application for "Recycling Partially-Stale Flash Blocks Using a Sliding Window for Multi-Level-Cell (MLC) Flash Memory", Ser. No. 11/674,645, filed Feb. 13, 2007 now U.S. Pat. No. 7,620,769, and U.S. patent application for "Two-Level RAM Lookup Table for Block and Page Allocation and Wear-Leveling in Limited-Write Flash Memories", Ser. No. 11/742,270, filed Apr. 30, 2007 U.S. Pat. No. 7,660,941.

This application is also a CIP of U.S. patent application for "Electronic data Flash Card with Various Flash Memory Cells", Ser No. 11/864,671, filed Sep. 28, 2007, now abandoned which is a CIP of U.S. patent application for "Managing Flash Memory Including Recycling Obsolete Sectors", Ser. No. 10/789,333, filed Feb. 26, 2004, now issued as U.S. Pat. No. 7,318,117.

This application is also a CIP of U.S. patent application for "System and Method for Providing a Flash Memory Assembly", Ser. No. 10/882,539, filed Jun. 30, 2004 now U.S. Pat. No. 7,394,661.

This application is also a CIP of U.S. patent application for "Electronic Data Storage Medium with Fingerprint Verification Capability", Ser. No. 11/624,667, filed on Jan. 18, 2007, now abandoned which is a divisional application of U.S. patent application Ser. No. 09/478,720, filed on Jan. 6, 2000, now U.S. Pat. No. 7,257,714 issued on Aug. 14, 2007.

FIELD OF THE INVENTION

The invention relates to flash memory devices, more particularly to systems and methods of managing memory addresses in a large capacity multi-level cell (MLC) based flash memory device.

BACKGROUND OF THE INVENTION

As flash memory technology becomes more advanced, flash memory is replacing traditional magnetic disks as storage media for mobile systems. Flash memory has significant advantages over floppy disks or magnetic hard disks such as having high-G resistance and low power dissipation. Because of the smaller physical size of flash memory, they are also more conducive to mobile systems. Accordingly, the flash memory trend has been growing because of its compatibility with mobile systems and low-power feature. However, advances in flash technology have created a greater variety of flash memory device types that vary for reasons of performance, cost and capacity. As such, a problem arises when mobile systems that are designed for one type of flash memory are constructed using another, incompatible type of flash memory.

New generation personal computer (PC) card technologies have been developed that combine flash memory with architecture that is compatible with the Universal Serial Bus (USB) standard. This has further fueled the flash memory trend because the USB standard is easy to implement and is popular with PC users. In addition, flash memory is replacing floppy disks because flash memory provides higher storage capacity and faster access speeds than floppy drives.

In addition to the limitations introduced by the USB standard, there are inherent limitations with flash memory. First, flash memory sectors that have already been programmed must be erased before being reprogrammed. Also, flash memory sectors have a limited life span; i.e., they can be erased only a limited number of times before failure. Accordingly, flash memory access is slow due to the erase-before-write nature and ongoing erasing will damage the flash memory sectors over time.

To address the speed problems with USB-standard flash memory, hardware and firmware utilize existing small computer systems interface (SCSI) protocols so that flash memory can function as mass-storage devices similarly to magnetic hard disks. SCSI protocols have been used in USB-standard mass-storage devices long before flash memory devices have been widely adopted as storage media. Accordingly, the USB standard has incorporated traditional SCSI protocols to manage flash memory.

As the demands for larger capacity storage increase, the flash memory device needs to keep up. Instead of using single-level cell flash memory, which stores one-bit of information per cell, multi-level cell (MLC) flash memory is used. The MLC flash memory allows at least two bits per cell. However, there are a number of problems associated with the MLC flash memory. First, the MLC flash memory has a low reliability. Secondly, the MLC flash memory data programming rules require writing to an ascending page in the same block or writing to a blank new page if there are data existed in the original page. Finally, a larger capacity requires a large logical-to-physical address look up table. In the prior art approach, the size look up table is in direct portion with the capacity of the flash memory. This creates a huge problem not only to the cost, but also to the physical size of the flash memory device. Furthermore, the traditional usage of the flash memory devices is generally in a very clean and relatively mild environment, thus the packaging design such as enclosure of the flash memory device is not suitable for hostile environment such as military and heavy industrial applications.

Therefore, it would be desirable to have improved methods and systems of managing memory addresses in a large capacity multi-level cell (MLC) flash memory device.

BRIEF SUMMARY OF THE INVENTION

This section is for the purpose of summarizing some aspects of the present invention and to briefly introduce some preferred embodiments. Simplifications or omissions in this section as well as in the abstract and the title herein may be made to avoid obscuring the purpose of the section. Such simplifications or omissions are not intended to limit the scope of the present invention.

Methods and systems of managing memory addresses in a large capacity multi-level cell (MLC) based flash memory device are disclosed. According to one aspect of the present invention, a MLC based flash memory device comprises a card body with a processing unit, an input/output (I/O) circuit and at least one MLC flash memory chip mounted thereon. The card body may comprise a print circuit board (PCB). The I/O circuits generally are coupled to the processing unit in form of an integrated circuit. The processing unit manages data transfers between a host computing device (e.g., personal computer, consumer electronic device) and the at least one flash memory chip. The MLC based flash memory chip is configured to provide data storage for the host.

According to another aspect of the present invention, a large capacity MLC base flash memory is partitioned into a plurality of blocks, each of the blocks is further partitioned into a plurality of pages and each page includes a plurality of sectors. For example, 128 pages per block, four sectors per page, and each sector contains 512-byte of data. Each page contains four sectors in the data area and additional bytes in the spare area. The spare area is configured to hold error correction code (ECC). In additional, bad block indicator, logical block address (LBA) and tracking number are also included in the first page of each block. Logical sector address (LSA) including LBA is used by the host to access the data stored on the flash memory. Each LBA must be converted to a physical block number (PBK#) before the data transfer can happen. In order to use a limited size memory to perform the LBA to 'PBK#' translation, the flash memory is divided into a plurality of sets (e.g., N sets) and each set contains a plurality of entries. Each entry includes one LBA to 'PBK#' correlation. And 'N' is a positive integer. Set, entry, page and sector numbers are extracted from a LSA.

According to yet another aspect of the present invention, N sets of partial logical-to-physical address and page usage information (hereinafter 'PLTPPUI') are stored in the reserved area of the MLC based flash memory. Only one the N sets is loaded to address correlation and page usage memory (ACPUM), which is a limited size random access memory (RAM). In one embodiment, static RAM (SRAM) is implemented for fast access time for the address correlation. LSA received together with the data transfer request dictates which one of the N sets of PLTPPUI is loaded into ACPUM.

According to yet another aspect of the present invention, the physical blocks designed for storing PLTPPUI is in the reserved area of the MLC based flash memory. The physical blocks located in the reserved area are referenced by a plurality of first special logical addresses used in the processing unit of the flash memory device. A PLTPPUI tracking table is configured to hold a plurality of entries containing correlations between a plurality first special logical addresses and its corresponding physical block number plus tracking number and highest page of the physical block. The PLTPPUI tracking table may be implemented in an SRAM. Similarly, a wear leveling counter and bad block indicator (WL/BB) tracking table is configured to track corresponding physical blocks to a set of second special logical addresses designated for storing the WL/BB information.

According to yet another aspect of the present invention, the PLTPPUI tracking table is rebuilt during the initialization of the flash memory device such as powering up when inserted into a host. The information to rebuild the PLTPPUI tracking table is stored in the spare area of the page of the physical block corresponding to the set of first special logical addresses. During initialization, all of the incorrect information (i.e., discrepancy between the physical state and the store information) is corrected.

According to yet another aspect of the present invention, the large capacity MLC based flash memory device may be manufactured as a flash memory core unit. The core unit may be configured as a printed circuit board (PCB) with an interface connector, a flash memory controller and at least one flash memory chip mounted thereon. An optional fingerprint sensor may also be mounted on the PCB. The core unit is generally housed with in an enclosure. The enclosure may be formed by one piece or two separate pieces of housing structures. The interface connector, for example, a Universal Serial Bus (USB) connector includes an input/output (I/O) interface circuit configured for establishing USB Bulk Only Transport (BOT) communications with a host computing device (host). There are four types of USB software communication data flow between the host and the I/O interface circuit of the flash memory device: control, interrupt, bulk, and isochronous. Control transfer is a data flow over the control pipe from the host to the flash memory device to provide configuration and control information. Interrupt transfer is a small-data, non-periodic, guaranteed-latency, device-initiated communication typically used for notifying the host that a service is needed by the flash memory device. Movement of large blocks of data across the I/O interface circuit that is not time critical relies on a bulk transfer. Isochronous transfer is used when working with isochronous data. Isochronous transfers provide periodic, continuous communication between the host and the flash memory device. There are two data transfer protocols generally supported by I/O interface circuits: Control/Bulk/Interrupt (CBI) protocol and Bulk-Only Transfer (BOT) protocol. The mass storage class CBI transport specification is approved for use with full-speed floppy disk drives, but is not used in high-speed capable devices, or in devices other than floppy disk drives (according to USB specifications). In accordance with an embodiment of the present invention, a flash memory device transfers high-speed data between the host and the flash memory device using only the BOT protocol, which is a more efficient and faster transfer protocol than CBI protocol because BOT transport of command, data, status rely on Bulk endpoints in addition to default Control endpoints.

According to yet another aspect of the present invention, a special design for industrial and military application on the finished assembly of the flash memory device includes a conforming coating to achieve the purposes of preventing oxidation of integrated circuit leads or soldering area; covering or protecting extreme temperature exposure either cold or hot; and waterproofing for certain military or industrial applications. The procedure of applying the conforming coating to the flash memory device 800 includes: 1) putting a masking cap or tape on specific area such as connectors, switches; 2) spraying or brushing the conforming coating material (e.g., HumiSeal® 1B73); and 3) inspecting the coated area with ultraviolet (UV) lights for imperfection (e.g., bubbles, missed coating area).

According one embodiment of the present invention, a method of managing memory address of a multi-level cell (MLC) based flash memory device comprises at least the following: receiving, in the MLC based flash memory device, a logical sector address (LSA) along with a data transfer request from a host computing device; extracting set, entry, page and sector numbers from the LSA with an indexing scheme; loading a set, corresponding to the set number, of partial logical-to-physical address and page usage information (PLTPPUI) into an address correlation page usage memory (ACPUM); reading a physical block number of flash memory of the MLC based flash memory device, the physical block number corresponds to the entry number in the ACPUM; and when the data transfer request is a read request, reading data from a physical page corresponding to the page number of the physical block number of the flash memory to a page buffer, and sending a request data sector from the page buffer in accordance with the sector number; when the data transfer request is a write request, writing page buffer contents to the physical page corresponding to the page number of the physical block number of the flash memory if the page buffer contents have been modified, writing a received data sector to the page buffer in accordance with the sector number and setting corresponding one of a plurality of sector update flags reflecting data sector just written to the page buffer.

According to another embodiment of the present invention, a system for managing memory address of a multi-level cell (MLC) based flash memory device comprises at least the following: an input/output interface circuit, coupling to a processing unit, configured for receiving a logical sector address (LSA) along with a data transfer request from a host computing device, the processing unit is configured for extracting set, entry, page and sector numbers from the LSA with an indexing scheme; said processing unit further comprises a page buffer, an address correlation page usage memory (ACPUM), a partial logical-to-physical address and page usage information (PLTPPUI) tracking table, a wear leveling counter and bad block indicator (WL/BB) tracking table; and a flash memory that includes a reserved area for a plurality of first physical blocks and a plurality of second physical blocks, the first physical blocks is referenced by a plurality of first special logical addresses while the second physical blocks by a plurality of second special logical addresses; wherein the plurality of first physical blocks is configured for storing PLTPPUI and the plurality of second physical blocks for storing wear leveling and bad block indicator, ACPUM is configured to keep one set, corresponding to the set number, of PLTPPUI, the PLTPPUI tracking table is configured to hold correlation between the first special logical addresses and the first physical blocks and the WL/BB tracking table is configured to hold correlation between the second special logical addresses and the second physical blocks.

One of the objects, features, and advantages of the present invention is to use a fixed size memory to manage logical to physical address correlation of a large memory capacity MLC based flash memory device. Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will be better understood with regard to the following description, appended claims, and accompanying drawings as follows:

FIGS. 4A-4F collectively show exemplary data structures used for managing memory addresses of the flash memory of FIG. 2A in accordance with one embodiment of the present invention;

FIGS. 5A-5E collectively show a flow chart of an exemplary process of conducting data transfer requests of the flash memory of FIG. 2A in accordance with one embodiment of the present invention;

DETAILED DESCRIPTION

In the following description, numerous details are set forth to provide a more thorough explanation of embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Used herein, the terms "upper", "lower", "top", "bottom", "front", "back", "rear", "side", "middle", "upwards", and "downwards" are intended to provide relative positions for the purposes of description, and are not intended to designate an absolute frame of reference. Further, the order of blocks in process flowcharts or diagrams representing one or more embodiments of the invention do not inherently indicate any particular order nor imply any limitations in the invention.

Embodiments of the present invention are discussed herein with reference to FIGS. 1A-8F. However, those skilled in the art will readily appreciate that the detailed description given herein with respect to these figures is for explanatory purposes as the invention extends beyond these limited embodiments.

Figure 1A:
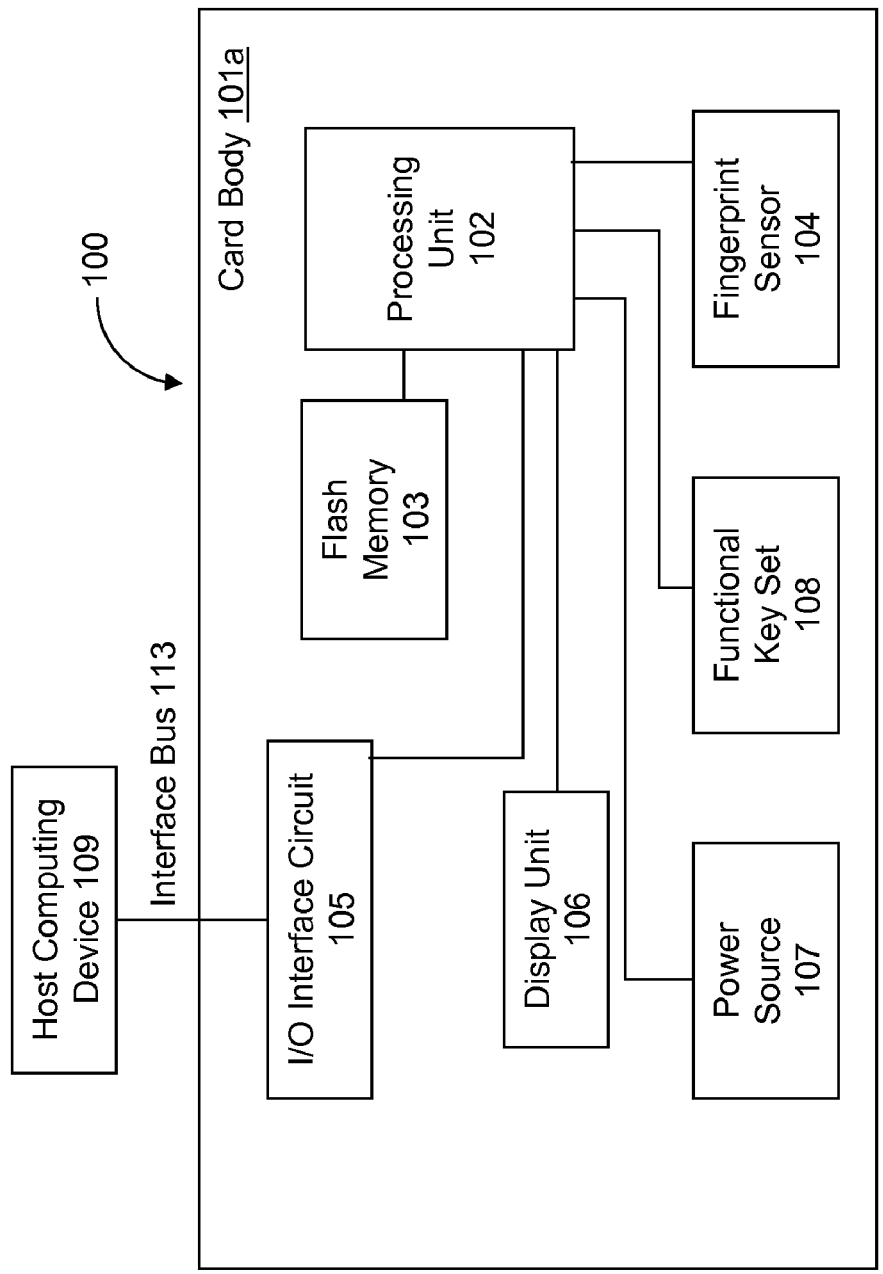
FIGS. 1A-1C are block diagrams showing three electronic environments, in which one embodiment of the present invention may be implemented in three respective exemplary electronic flash memory devices.
Figure 1B:
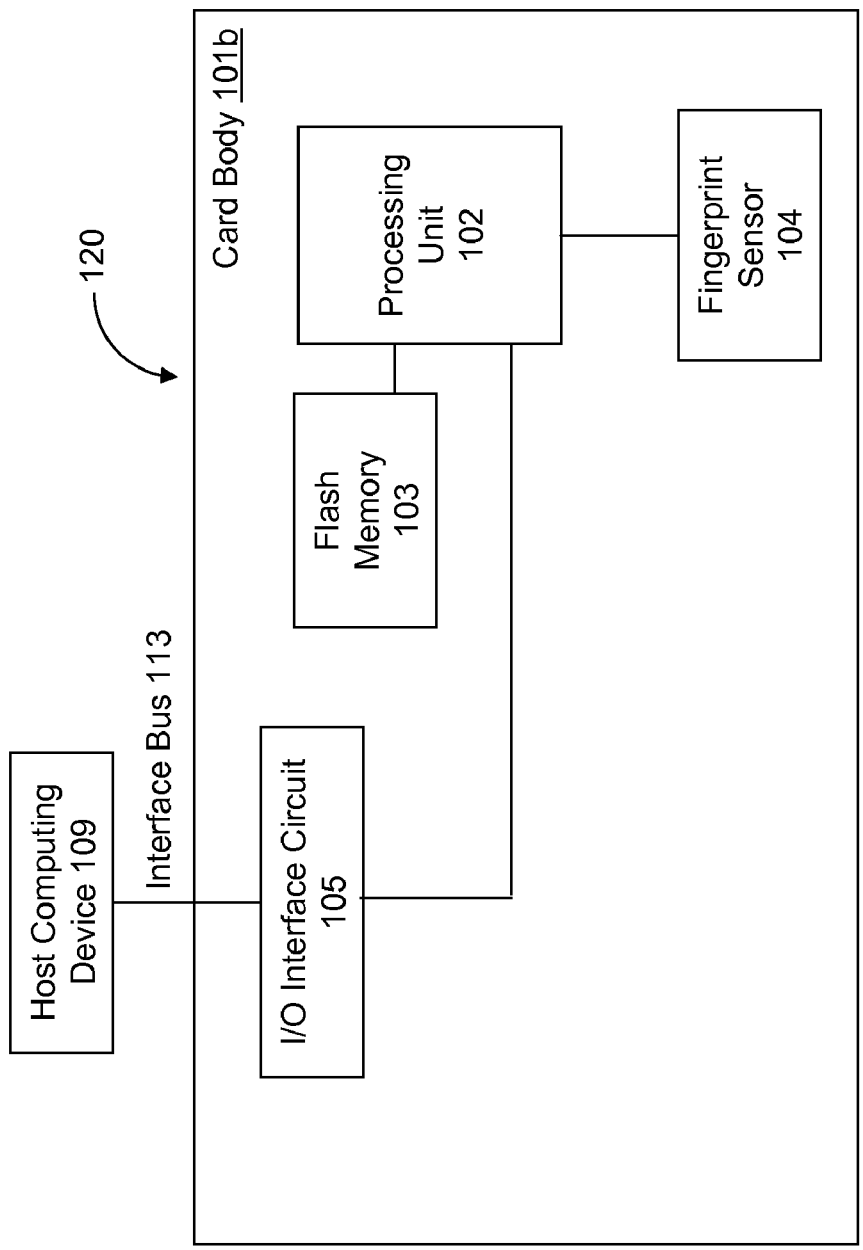
Figure 1C:
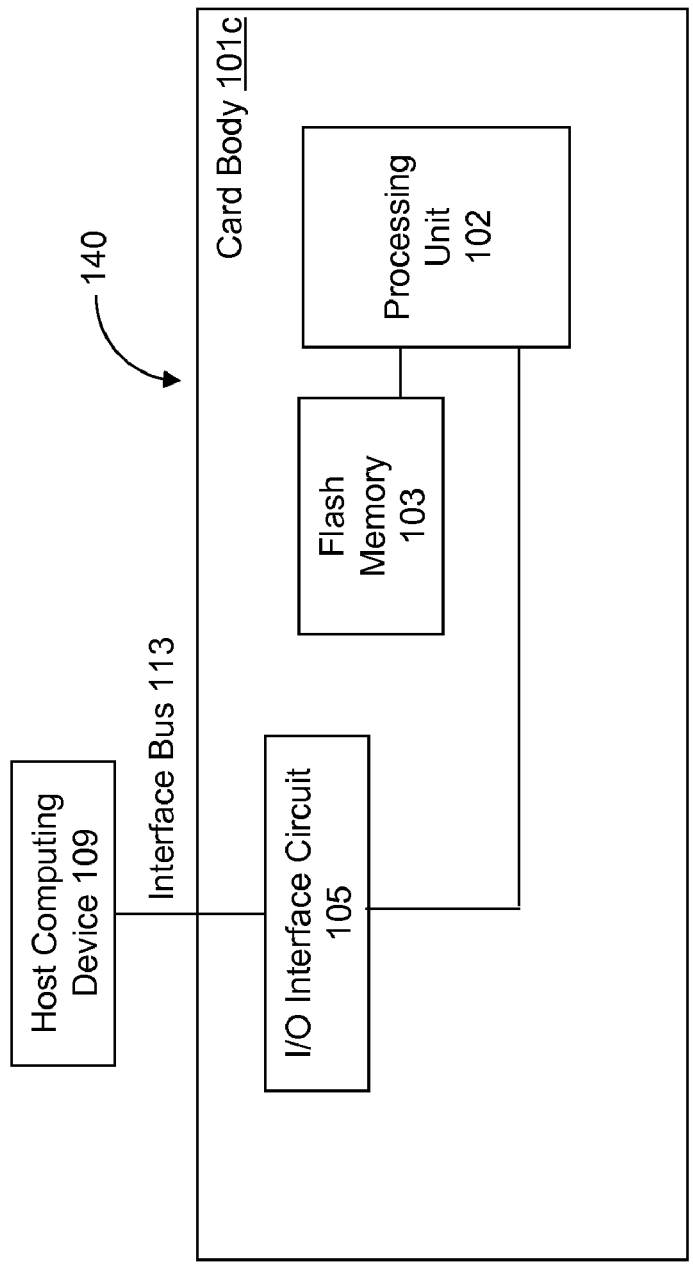

FIGS. 1A-1C are block diagrams illustrating three electronic environments, in which one embodiment of the present invention may be deployed in three respective exemplary electronic flash memory devices. Shown in FIG. 1A is a first electronic environment. A first flash memory device 100 is adapted to be accessed by a host computing device 109 via an interface bus 113. The first flash memory device 100 includes a card body 101a, a processing unit 102, at least one flash memory module 103, a fingerprint sensor 104, an input/output (I/O) interface circuit 105, an optional display unit 106, an optional power source (e.g., battery) 107, and an optional function key set 108. The host computing device 109 may include, but not be limited to, a desktop computer, a laptop computer, a mother board of a personal computer, a cellular phone, a digital camera, a digital camcorder, a personal multimedia player.

The card body 101a is configured for providing electrical and mechanical connection for the processing unit 102, the flash memory module 103, the I/O interface circuit 105, and all of the optional components. The card body 101a may comprise a printed circuit board (PCB) or an equivalent substrate such that all of the components as integrated circuits may be mounted thereon. The substrate may be manufactured using surface mount technology (SMT) or chip on board (COB) technology.

The processing unit 102 and the I/O interface circuit 105 are collectively configured to provide various control functions (e.g., data read, write and erase transactions) of the flash memory module 103. The processing unit 102 may also be a standalone microprocessor or microcontroller, for example, an 8051, 8052, or 80286 Intel® microprocessor, or ARM®, MIPS® or other equivalent digital signal processor. The processing unit 102 and the I/O interface circuit 105 may be made in a single integrated circuit, for application specific integrated circuit (ASIC).

The at least one flash memory module 103 may comprise one or more flash memory chips or integrated circuits. The flash memory chips may be single-level cell (SLC) or multi-level cell (MLC) based. In SLC flash memory, each cell holds one bit of information, while more than one bit (e.g., 2, 4 or more bits) are stored in a MLC flash memory cell. A detail data structure of an exemplary flash memory is described and shown in FIG. 2A and corresponding descriptions thereof.

The fingerprint sensor 104 is mounted on the card body 101a, and is adapted to scan a fingerprint of a user of the first electronic flash memory device 100 to generate fingerprint scan data. Details of the fingerprint sensor 104 are shown and described in a co-inventor's U.S. Pat. No. 7,257,714, entitled "Electronic Data Storage Medium with Fingerprint Verification Capability" issued on Aug. 14, 2007, the entire content of which is incorporated herein by reference.

The flash memory module 103 stores, in a known manner therein, one or more data files, a reference password, and the fingerprint reference data obtained by scanning a fingerprint of one or more authorized users of the first flash memory device. Only authorized users can access the stored data files. The data file can be a picture file, a text file or any other file. Since the electronic data storage compares fingerprint scan data obtained by scanning a fingerprint of a user of the device with the fingerprint reference data in the memory device to verify if the user is the assigned user, the electronic data storage can only be used by the assigned user so as to reduce the risks involved when the electronic data storage is stolen or misplaced.

The input/output interface circuit 105 is mounted on the card body 101a, and can be activated so as to establish communication with the host computing device 109 by way of an appropriate socket via an interface bus 113. The input/output interface circuit 105 may include circuits and control logic associated with a Universal Serial Bus (USB) interface structure that is connectable to an associated socket connected to or mounted on the host computing device 109. The input/output interface circuit 105 may also be other interfaces including, but not limited to, Secure Digital (SD) interface circuit, Micro SD interface circuit, Multi-Media Card (MMC) interface circuit, Compact Flash (CF) interface circuit, Memory Stick (MS) interface circuit, PCI-Express interface circuit, a Integrated Drive Electronics (IDE) interface circuit, Serial Advanced Technology Attachment (SATA) interface circuit, external SATA, Radio Frequency Identification (RFID) interface circuit, fiber channel interface circuit, optical connection interface circuit.

The processing unit 102 is controlled by a software program module (e.g., a firmware (FW)), which may be stored partially in a ROM (not shown) such that processing unit 102 is operable selectively in: (1) a data programming or write mode, where the processing unit 102 activates the input/output interface circuit 105 to receive data from the host computing device 109 and/or the fingerprint reference data from fingerprint sensor 104 under the control of the host computing device 109, and store the data and/or the fingerprint reference data in the flash memory module 103; (2) a data retrieving or read mode, where the processing unit 102 activates the input/output interface circuit 105 to transmit data stored in the flash memory module 103 to the host computing device 109; or (3) a data resetting or erasing mode, where data in stale data blocks are erased or reset from the flash memory module 103. In operation, host computing device 109 sends write and read data transfer requests to the first flash memory device 100 via the interface bus 113, then the input/output interface circuit 105 to the processing unit 102, which in turn utilizes a flash memory controller (not shown or embedded in the processing unit) to read from or write to the associated at least one flash memory module 103. In one embodiment, for further security protection, the processing unit 102 automatically initiates an operation of the data resetting mode upon detecting a predefined time period has elapsed since the last authorized access of the data stored in the flash memory module 103.

The optional power source 107 is mounted on the card body 101a, and is connected to the processing unit 102 and other associated units on card body 101a for supplying electrical power (to all card functions) thereto. The optional function key set 108, which is also mounted on the card body 101a, is connected to the processing unit 102, and is operable so as to initiate operation of processing unit 102 in a selected one of the programming, data retrieving and data resetting modes. The function key set 108 may be operable to provide an input password to the processing unit 102. The processing unit 102 compares the input password with the reference password stored in the flash memory module 103, and initiates authorized operation of the first flash memory device 100 upon verifying that the input password corresponds with the reference password. The optional display unit 106 is mounted on the card body 101a, and is connected to and controlled by the processing unit 102 for displaying data exchanged with the host computing device 109.

A second electronic environment is shown in a second environment in FIG. 1B. The second environment is very similar to the first environment as shown in FIG. 1A. The differences are the optional components (i.e., display unit 106, power source 107 and functional key set 108) are not included in card body 101b of the second electronic flash memory device 120. Instead, such functionalities may be implemented using the existing ones provided by the host computer 109 via the interface bus 113.

Shown in FIG. 1C, the third electronic flash memory device 140 includes a card body 101c with a processing unit 102, an I/O interface circuit 105 and at least one flash memory module 103 mounted thereon. Similar to the two aforementioned environments, the third flash memory device 140 couples to a host computing device 109 via an interface bus 113. Fingerprint functions such as scanning and verification are handled by the host computing device 109.

Figure 2A:
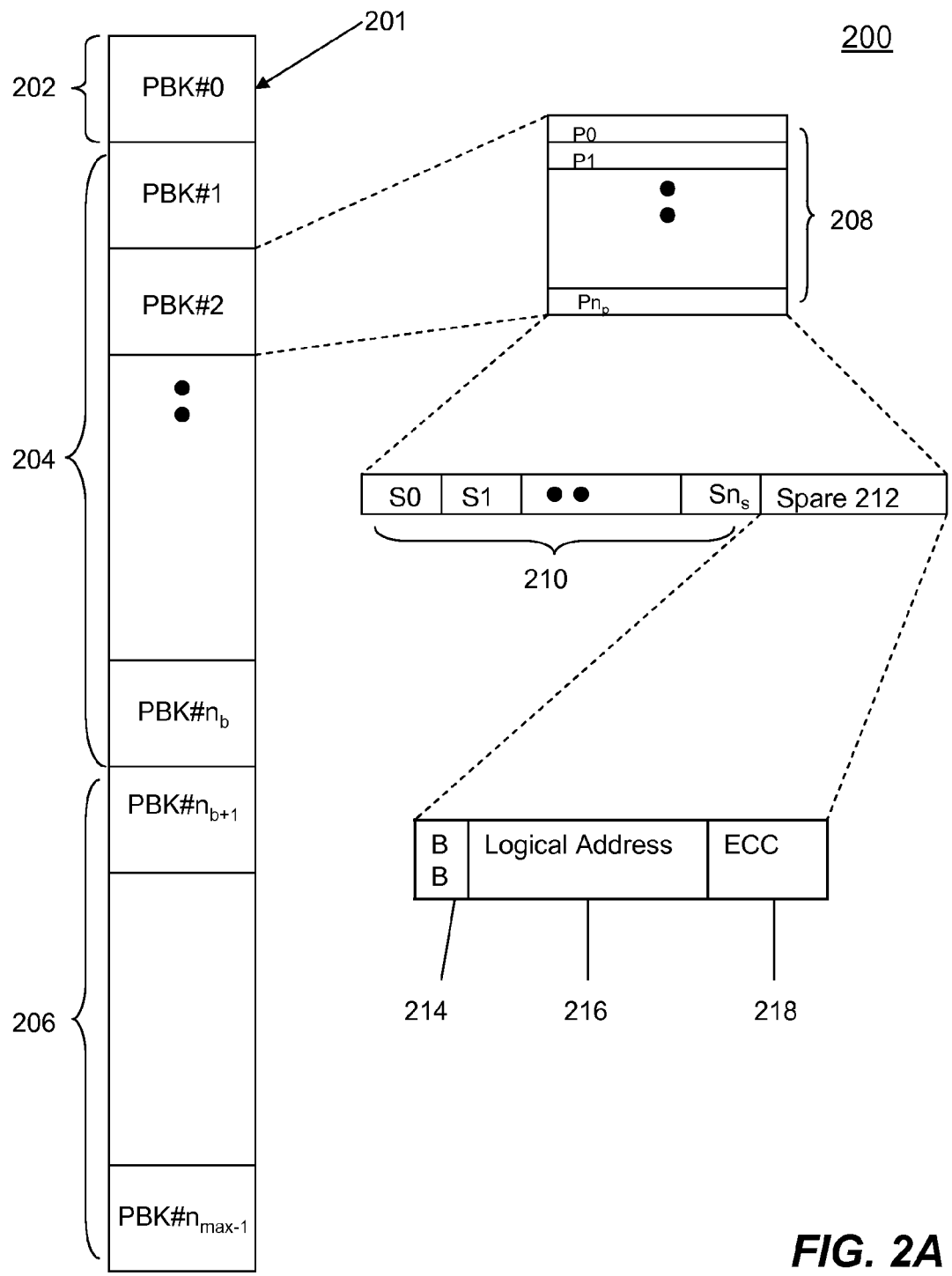
FIG. 2A is a diagram depicting a data structure of an exemplary large capacity flash memory, according one embodiment of the present invention.

Referring now to FIG. 2A, which is a diagram depicting an exemplary data structure 200 of a flash memory module 201 (e.g., flash memory module 103 of FIG. 1C) in accordance with one embodiment of the present invention. The flash memory module 201 is divided into a plurality of physical blocks e.g., PBK#0, PBK#1, PBK#2, ... ). In general, there are three categories of physical blocks: 1) the first block 202 (i.e., PBK#0); 2) normal usage data blocks 204 (i.e., PBK#1, PBK#2, .... PBK#$n_b$); and 3) reserved blocks 206 (i.e., PBK#$n_{b+1}$, ... PBK#$n_{max-1}$). The first block (PBK#0) 202 is guaranteed to be a good block and used by the manufacturer to store certain information such as Flash Timing Parameter (FTP), and other information by Initial Manufacturing Program (IMP), which cannot be alter by users. The manufacturer may define a percentage (e.g., 95%) of the total capacity as normal usage data blocks and the rest as reserved. The normal usage data blocks 204 are configured for user to store user data, although the first block (i.e., PBK#1) of the normal usage data blocks 204 is generally used for storing Master Boot Record (MBR), which contains critical data for operation of a computing device. Lastly, the reserved blocks 206 are configured to be accessed by a program module (e.g., FW) via special memory addresses in accordance with one embodiment of the present invention. Examples of the special memory address are 0xFFFF0000, 0xFFFF0001, 0xFFFFFF00, 0xFFFFFF01, etc.

Each block is further divided into a plurality of pages 208 (e.g., P0, P1, ..., P$n_p$). Each of the pages 208 includes a data area 210 and a spare area 212. The data area is partitioned into a plurality of sectors (e.g., S0, S1, ..., S$n_s$). In one embodiment, each sector stores 512-byte of data. The spare area 212 is configured to provide three different fields: 1) a block indicator (BB) 214, a logical address area 216 and an error correction code (ECC) area 218. When a block is tested no good by the manufacturer, the block indicator 214 of that block is set to a special code to indicate a bad block that cannot be used. The logical address area 216 is configured for identifying of that particular physical block for initialization of the flash memory device. More details are described in FIG. 4E and FIG. 4F for the reserved physical blocks as used by an embodiment of the present invention. Detailed processes of initialization are shown in FIGS. 7A-7E. The ECC area 218 is configured to store the ECC for ensuring data integrity.

In order to access the data stored in the normal usage blocks 204 of the flash memory module 201, the host computing device 109 transmits a data transaction request (e.g., data read or write) along with a logical sector address (LSA) to the flash memory device (e.g., flash memory device 140 of FIG. 1C). The processing unit 102 of the flash memory device converts the received LSA into a physical address (i.e., specific block, page and sector numbers) before any data transaction can be performed. Traditionally, the conversion is performed by an address look up table with a one-to-one relationship to the physical address. This solution works for a flash memory device with relatively small capacity, because the address look up table is implemented with a static random access memory (SRAM). It would not be feasible in terms of cost and physical space to include SRAM that grows linearly as the capacity of the flash memory device especially for a large capacity MLC based flash memory device. For example, a large capacity (say 32 Giga-Byte (GB)) MLC based flash memory device using 2112-byte page (i.e., 2048-byte data plus 64-byte spare) and 128 pages per block, it would require more than 2 MB bytes of SRAM to hold the entire address look up table.

Figure 2B:
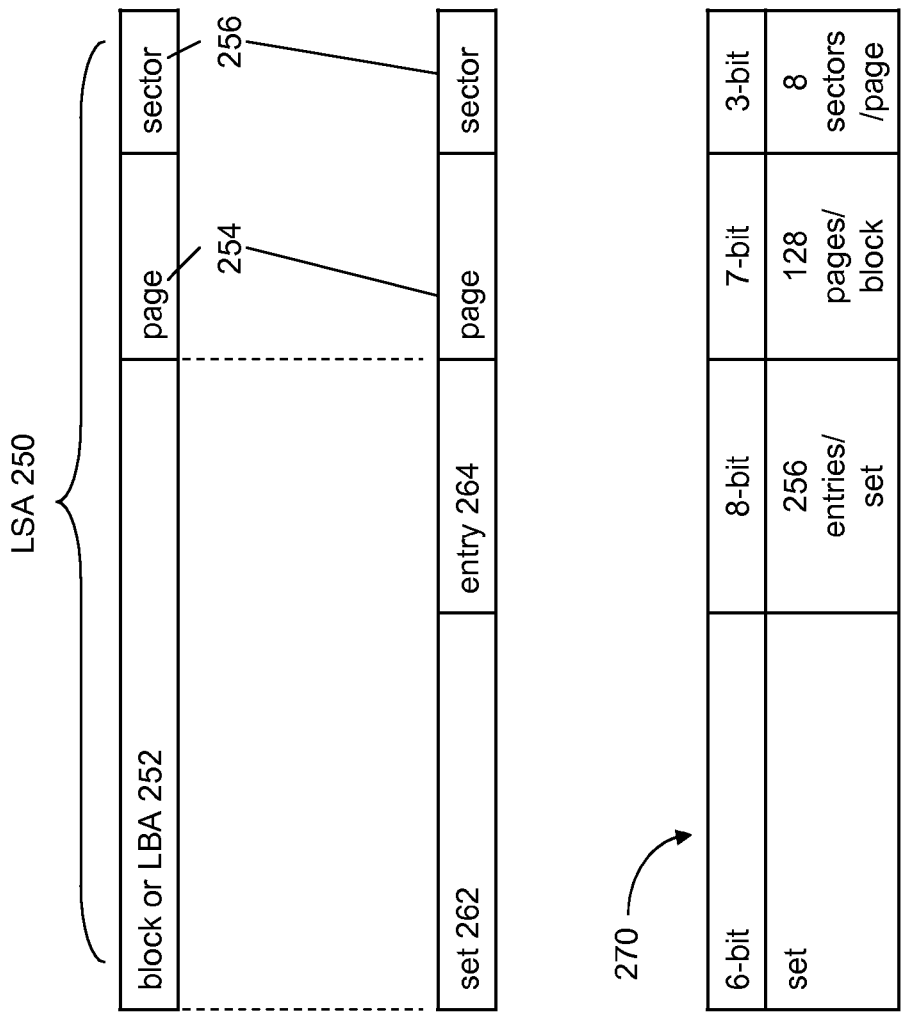
FIG. 2B is a diagram showing an exemplary scheme for partitioning a logical sector address in accordance with one embodiment of the present invention.

FIG. 2B is a diagram showing an exemplary scheme for partitioning a logical sector address in accordance with one embodiment of the present invention. A logical sector address (LSA) 250 is traditionally partitioned as three parts: block 252, page 254 and sector 256. The block portion 252 is also referred to as logical block address (LBA). According to one aspect of the present invention, the LSA 250 is partitioned into four parts: set 262, entry 264, page 254 and sector 256. The page 254 and sector 256 remain the same. And the block 252 is further partitioned into two parts: the set 262 and the entry 264. In other words, instead of just using block 252 as basic unit, the blocks are divided into a plurality of sets 262. Each of the sets 262 includes a plurality of entries 264. For example, if a 24-bit LSA 270 is partitioned in the following manner: 6-bit for set, 8-bit for entry, 8-bit for page and 3-bit for sector, the LSA 270 could represent up to 64 sets of 256 entries (i.e., 16,384 blocks) with each block containing 128 pages and each page containing 8 sectors of 512-byte of data. In this document, the number of the plurality of sets is N, where N is a positive integer.

To carry out the address partition scheme of the present invention, the manufacturer may predefine number of sets and entries in the first physical block (i.e., PBK#0) by the IMP. Instead of mapping all of the logical sector addresses (LSA) to a physical address in a memory, only a portion of the LSA (i.e., a set) is included such that only a limited size of memory is required for address correlation and page usage information. In other words, a limited size memory is configured to hold one set of entries with each entry including an address of the corresponding physical block and a plurality of corresponding page usage flags (see FIG. 4A for details). For example, 18-byte (i.e., 2-byte for the physical block address plus 128-bit or 16-byte for 128 page usage flags) is required for each entry, hence a total of 4608-byte of memory is required for a set with 256 entries.

However, in order to correlate a logical block address to a unique physical block, every entry in each of the plurality of sets must correlate to a unique physical address and a set of page usage flags. Since the limited size memory only has capacity of holding one set of such information, an embodiment of the present invention requires that information of all of the plurality of sets be stored in reserved area 206 of the flash memory 201. Only a relevant set of the plurality of sets is loaded into the limited size memory in response to a particular data transfer request from a host computing system 109. The relevant set is defined as the set with one of the entries matches the entry number derived from the LSA associated with the received data transfer request.

Since there are N sets of address correlation and page usage information stored in the flash memory, each of the N sets is referred to as a partial logical-to-physical address and page usage information (hereinafter 'PLTPPUI') appended with a set number (e.g., 'PLTPPUI0', 'PLTPPUI1', ... 'PLTPPUIN').

In order to simplify the examples and drawings in the Specification, an example with small numbers is used for demonstrate the relationship between LSA, LBA, sector, page, entry and set numbers. Those of ordinary skill in the art will understand implementation of an embodiment of the present invention can be with larger numbers. The following example uses a flash memory with four sectors per page, four pages per block and four entries per set and a logical sector address 159 (i.e., LSA=159) is represented by a binary number "10 01 11 11". As a result, the least significant four bits of LSA represent sector and page numbers with the two lowest bits for the sector number and the next two for the page number, as each two-bit represents four distinct choices—0, 1, 2 and 3. After truncating the four least significant bits of LSA, the remaining address becomes the corresponding logical block address (LBA). In this example, LBA has a binary value of '1001'. Because there are four entries per set in this example, two least significant bits of LBA represent the entry number (i.e., offset number in each set). The remaining high bits of LBA represent the set number. A summary of this example is listed in Table 1.

TABLE 1

| 10 | 01 | 11 | 11 |
|---|---|---|---|
| Set Number | Entry Number | Page Number | Sector Number |

According to one aspect of the present invention, an indexing scheme enables the processing unit 102 to translate logical sector addresses (LSAs) and/or logical block addresses (LBAs) provided, in conjunction with a data transfer request, by the host computing device 109 to physical block numbers or addresses (PBK#) in the flash memory device 140. The indexing scheme comprises a plurality of sets of PLTPPUI and physical characteristics of the flash memory such as total number of sets, entries, pages and sectors. And ratios among the set, entry, page and sector. The processing unit 102 can utilize the indexing scheme to determine which sectors of the flash memory are available for each particular data transfer request.

Figure 3:
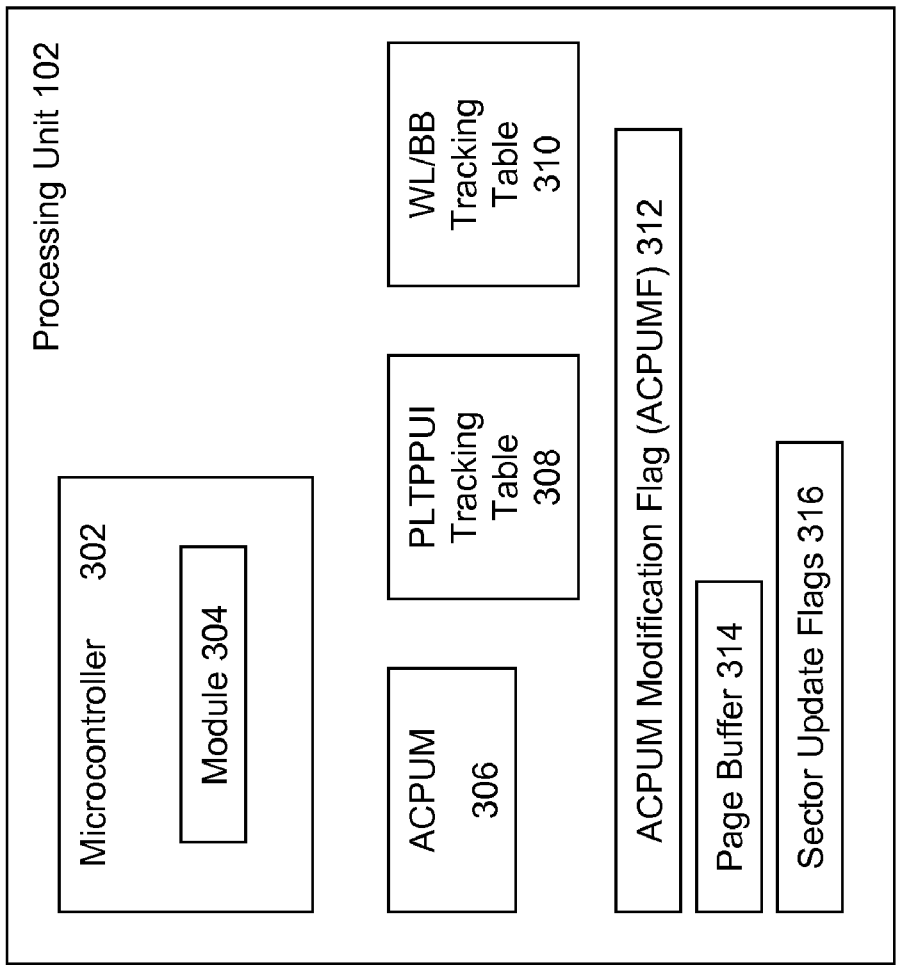
FIG. 3 is a simplified block diagram illustrating salient components of an exemplary processing unit of each of the electronic flash memory devices of FIGS. 1A-1C, according to an embodiment of the present invention.
Figure 4A:
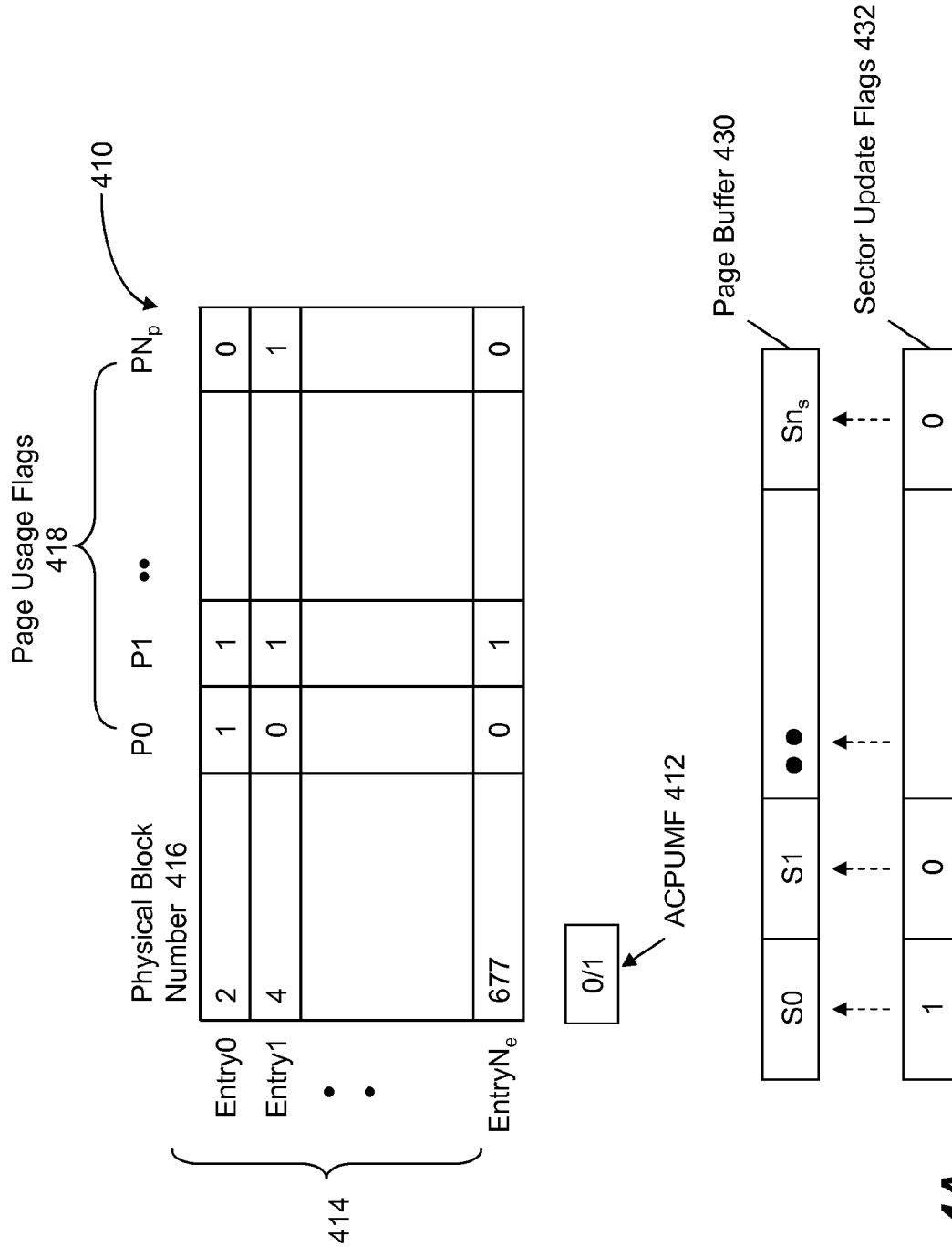
Figure 4B:
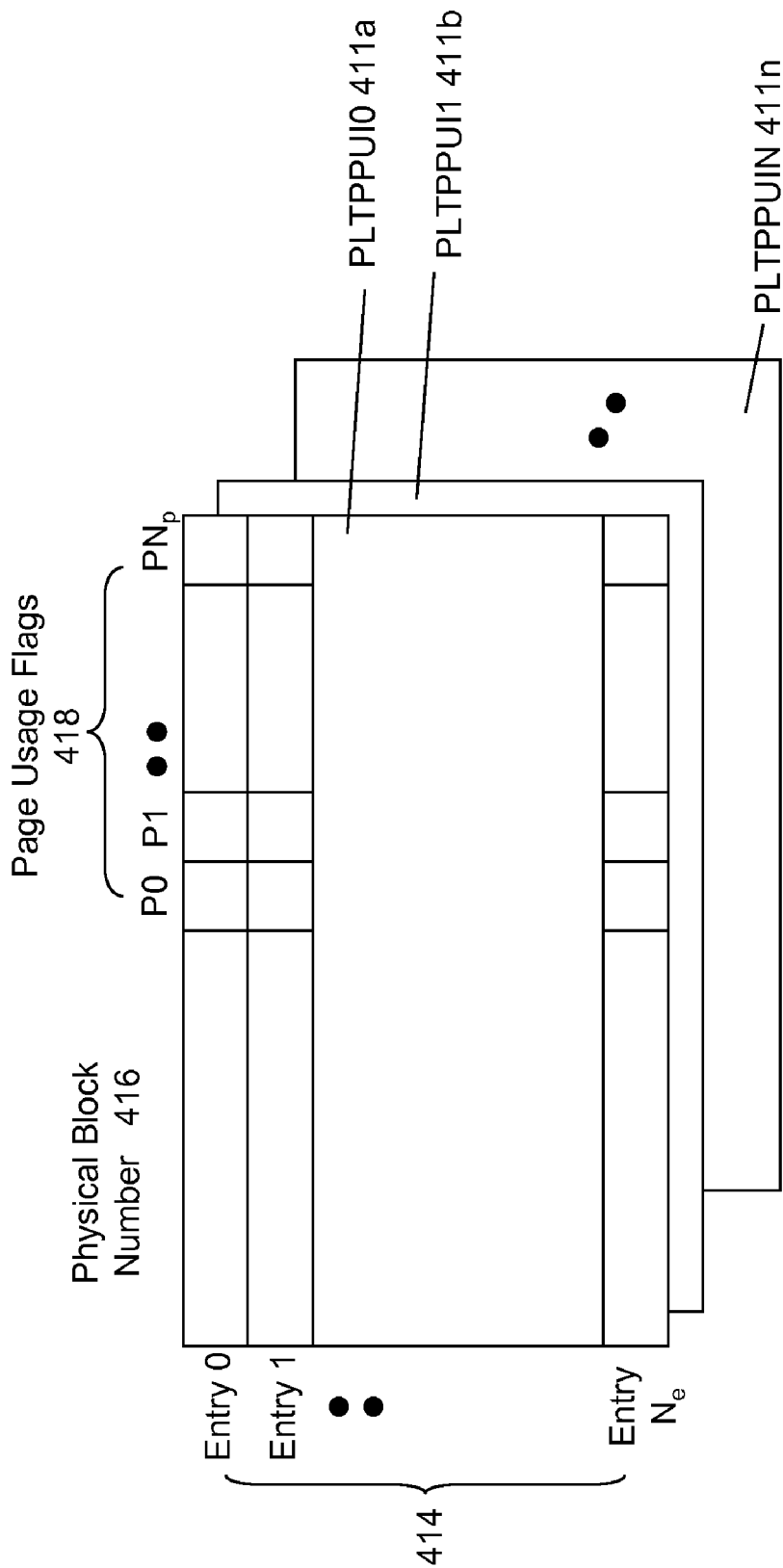

FIG. 3 is a simplified block diagram showing salient components of the process unit 102 of an electronic flash memory device (e.g., flash memory devices 102 of FIG. 1C) in accordance with one embodiment of the present invention. The processing unit 102 comprises a microcontroller or microprocessor 302, an address correlation and page usage memory (ACPUM) 306, a PLTPPUI tracking table 308, a wear leveling and bad block (WL/BB) tracking table 310, a ACPUM modification flag (ACPUMF) 312, a page buffer 314 and a set of sector update flags 316.

The microcontroller 302 with a flash memory controlling program module 304 (e.g., a firmware (FW)) installed thereon is configured to control the data transfer between the host computing device 109 and the at least one flash memory module 103. The ACPUM 306 is configured to provide an address correlation table, which contains a plurality of entries, each represents a correlation between a partial logical block address (i.e., entries) to the corresponding physical block number. In addition, a set of page usage flags associated with the physical block is also included in each entry. The ACPUM 306 represents only one of the N sets of PLTPPUI, which is stored in the reserved area of the flash memory. In order to keep tracking the physical location (i.e., physical block number) of each of the N sets of PLTPPUI, the physical location is stored in the PLTPPUI tracking table 308. Each item is the PLTPPUI tracking table 308 corresponds a first special logical address to one of the N sets of PLTPPUI. The wear leveling counters and bad block indicator for each physical block is stored in a number of physical blocks referred by corresponding second special logical addresses (e.g., '0xFFFFFF00'). The WL/BB tracking table 310 is configured to store physical block numbers that are assigned or allocated for storing these physical block wear leveling counters and bad blocks. The ACPUM modification flag (ACPUMF) 312 is configured to hold an indicator bit that tracks whether the ACPUM 306 has been modified or not. The page buffer 314 is configured to hold data in a data transfer request. The page buffer 314 has a size equaling to the page size of the flash memory 201. The sector update flags 316 are configured to hold valid data flag for each of the corresponding sectors written into data area of the page buffer 314. For example, four sector update flags are be required for a page buffer comprising four sectors. The page buffer 314 also includes a spare area for holding other vital information such as error correction code (ECC) for ensuring data integrity of the flash memory.

FIGS. 4A-4F collectively show exemplary data structures used for managing memory addresses of the flash memory of FIG. 2A in accordance with one embodiment of the present invention. The ACPUM data structure 410 contains $N_e$ rows of entries 414, where $N_e$ is a positive integer. Each row contains a physical block number or address (PBK#) 416 and a plurality of page usage flags 418 associated with the PBK#. The number of pages ($N_p$) is determined by the physical flash memory cell structure and defined by the IMP. ACPUMF 412 contains one bit, which is a toggle switch representing whether the ACPUM 306 has been modified or not. The ACPUMF 412 may be implemented as a register containing either 0 (not modified) or 1 (modified). The page buffer 430 includes a data area containing plurality of sectors (S1, S2, . . . , $Sn_s$) and a spare area (not shown in FIG. 4A) containing other information such as ECC. A set of sector update flags 432 is configured to represent respective sectors in the page buffer 430. Each of the sector update flags 432 indicates either a corresponding sector contains a valid data or not. In one implementation, valid data is represented as "1", while initial or stale state as "0". These flags may be implemented in a different logic such as reversing the binary representation. As discussed in the prior sections and shown in FIG. 4B, there are N sets of PLTPPUI 411a-n, where N is a positive integer. The N sets of PLTPPUI 411a-n represent all of the logical blocks in correlation with physical blocks. Only one of the N sets is loaded into the ACPUM 306 at one time.

Each set of the PLTPPUI is stored in the reserved area 206 of the flash memory 201 of FIG. 2A in a data structure 420 shown in FIG. 4C. The contents of each set of PLTPPUI are stored in one page of a physical block. For example, the PLTPPUI0 is stored at one of a plurality of first special logical addresses "0xFFFF0000", which corresponds to the first page (P0) 424a of a physical block 'PBK#1000' 422 initially. Due to the MLC flash memory data programming rules, each page can only be programmed or written once (i.e., NOP=1) and data programming within one block can only be in a ascending page order. The second data programming or write can only be into the second page (P1) 424b until the $n^{th}$ write to the last page (Pn) 424n of the block 'PBK#1000' 422. After that, the next data programming, the $(n+1)^{th}$ write, must be written to the first page (P0) 434 of a new physical block (PBK#1012) 432 just assigned or allocated according to the WL rules. In storing ACPUM 306 into the flash memory, each entry of the ACPUM 306 is written sequentially in the data area 425 of the page. When a first page of a new block is programmed, after the data area has been written, other vital information is written into the spare area 426. The other information include at least the following: a bad block indicator 427, the special logical address 428 issued by the FW for each of the N sets of PLTPPUI and a tracking number 429 for each special logical address. The bad block indicator 427 showing 'FF' means a good block. The first special logical address 442 may be '0xFFFF0000'. And the tracking number (TN) 446 is set to zero for an initial physical block corresponding to each of the first special logical addresses. The tracking number 446 is incremented by one as a new block is assigned or allocated for storing a particular set of PLTPPUI.

FIG. 4D is a diagram illustrating an exemplary data structure 440 of the PLTPPUI tracking table 308 of FIG. 3. The PLTPPUI tracking table 308 contains a plurality of rows representing a plurality of first special logical addresses 442, one for each of the N sets of PLTPPUI. Each of the N rows contains a physical block number 444, a tracking number (TN) 446 and highest page number 448. The first row of the PLTPPUI tracking table 308 corresponds to the example shown in FIG. 4C.

Similar to the data structure of the PLTPPUI tracking table, an exemplary data structure 450 of a WL/BB tracking table 310 is shown in FIG. 4E. Instead of first special logical addresses for each of the N sets of PLTPPUI, each row is for a second special address 452 of a block of the WL/BB tracking table 310. In one implementation, the second special address 452 may be '0xFFFFFFF0'. An exemplary data structure 460 for storing the WL/BB tracking table in the reserved area of a flash memory is shown in FIG. 4F. Similarly, the MLC flash memory data programming rules dictate the data to be written to a new page for each update. The spare area stores the block indicator 467, the second special logical address 452 and tracking number 456.

Referring now to FIGS. 5A-5E, which collectively show a flowchart illustrating an exemplary process 500 of conducting data transfer requests of the flash memory of FIG. 2A in accordance with one embodiment of the present invention. The process 500 is preferably understood in conjunction with previous figures and examples shown in FIGS. 6A-6D. The process 500 is performed by the microcontroller 302 with a flash memory controller program module 304 installed thereon.

The process 500 starts in an 'IDLE' state until the microcontroller 302 receives a data transfer request from a host (e.g., the host computing device 109 of FIG. 1C) at 502. Also received in the data transfer request is a logical sector address (LSA), which indicates the location the host wishes to either read or write a sector of data (i.e., 512-byte sector). Based on the parameters defined by the IMP and the physical characteristics of the MLC based flash memory, the received LSA is processed to extract the set, entry, page and sector numbers (see Table 1 for an example) included therein. After the received LSA has been processed, the process 500 moves to decision 504. It is determined whether the ACPUM 306 has been loaded with a set of PLTPPUI that covers the received LSA. If 'yes', the process 500 reads out the physical block number (PBK#) corresponding to the entry number of the received LSA at 516 before moving to another decision 518, in which it is determined whether the data transfer request is read or write (i.e., program).

If the decision 504 is 'no', the process 500 moves to decision 506. The process 500 checks whether the contents of the page buffer 430 need to be stored. In one implementation, the process 500 checks the sector update flags 432 that correspond to sectors in the page buffer 430. If any one of the flags 432 has been set to 'valid', then the contents of the page buffer 430 must be stored to the corresponding page of the corresponding physical block of the MLC flash memory at 550 (i.e., the decision 506 is 'yes'). Detailed process of step 550 is shown and described in FIG. 5D. After the contents of the page buffer 430 have been stored, the process 500 sets the ACPUM modification flag (ACPUMF) 412 to a 'modified' status at 508. In other words, the ACPUM 306 has been modified and needs to be stored in the flash memory in the future. Then the process 500 moves to yet another decision 510.

Otherwise if 'no' at decision 506, the process 500 moves the decision 510 directly. It is then determined if the ACPUM 306 has been modified. If 'yes', the process 500 moves to 580, in which, the process 500 writes the contents of the ACPUM 306 to one of a plurality of first special logical addresses (e.g., '0XFFFF00000' for PLTPPUI0, or '0xFFFF0001' for PLTPPUI1, etc.) for storing corresponding set of PLTPPUI in the reserved area of the flash memory. The ACPUM modification flag 412 is reset at the end of 580. Detailed process of step 580 is shown and described in FIG. 5E. Then, at 514, the process 500 loads a corresponding set of PLTPPUI to the ACPUM 306 from the flash memory based on the set number extracted from the received LSA. Once the ACPUM 306 has been loaded, the process 500 reads the physical block number that corresponds to the entry number at 516 before moving to decision 518. If 'no' at decision 510, the process 500 skips step 580 and goes directly to 514.

Figure 5A:
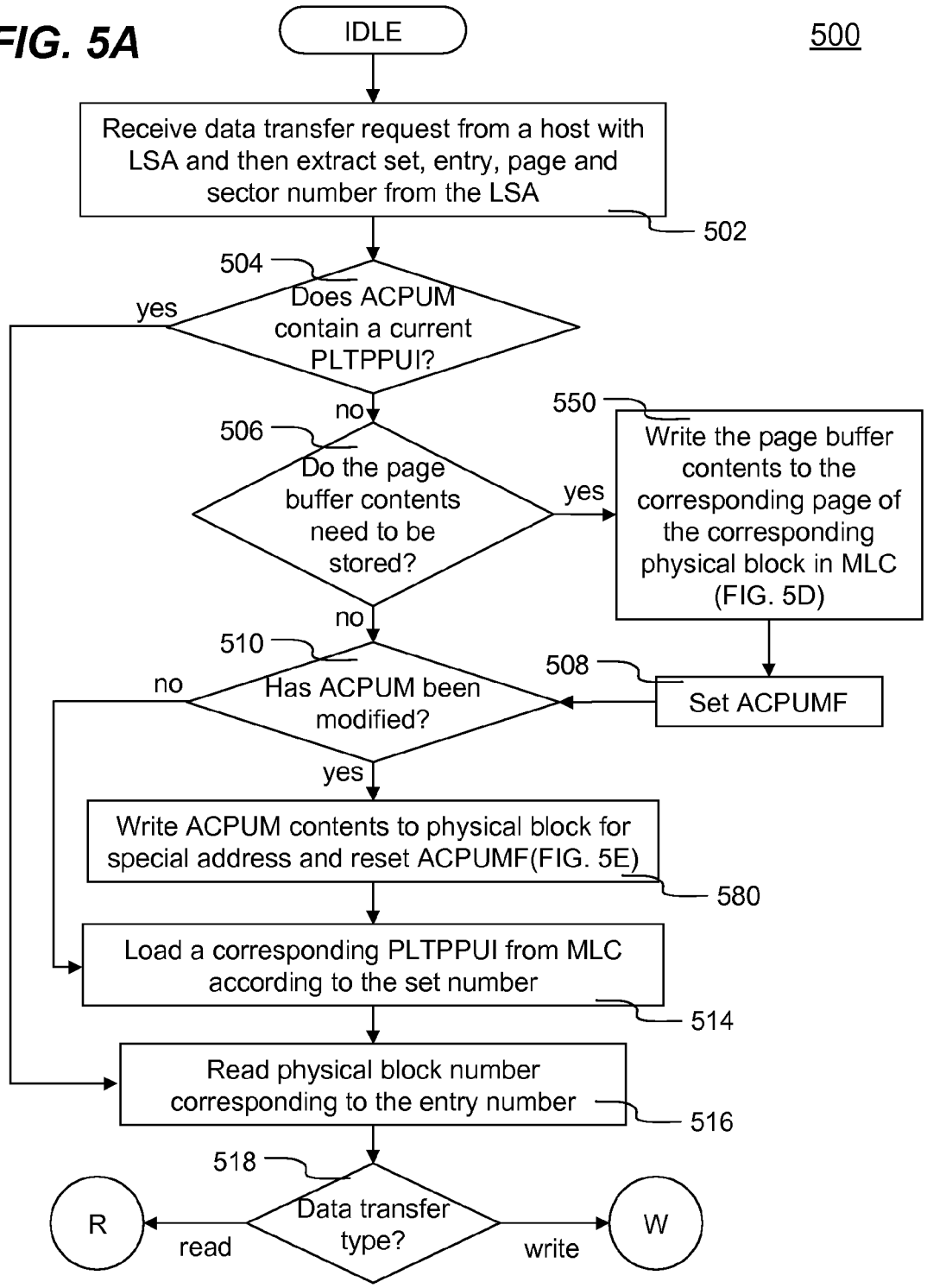
Figure 5B:
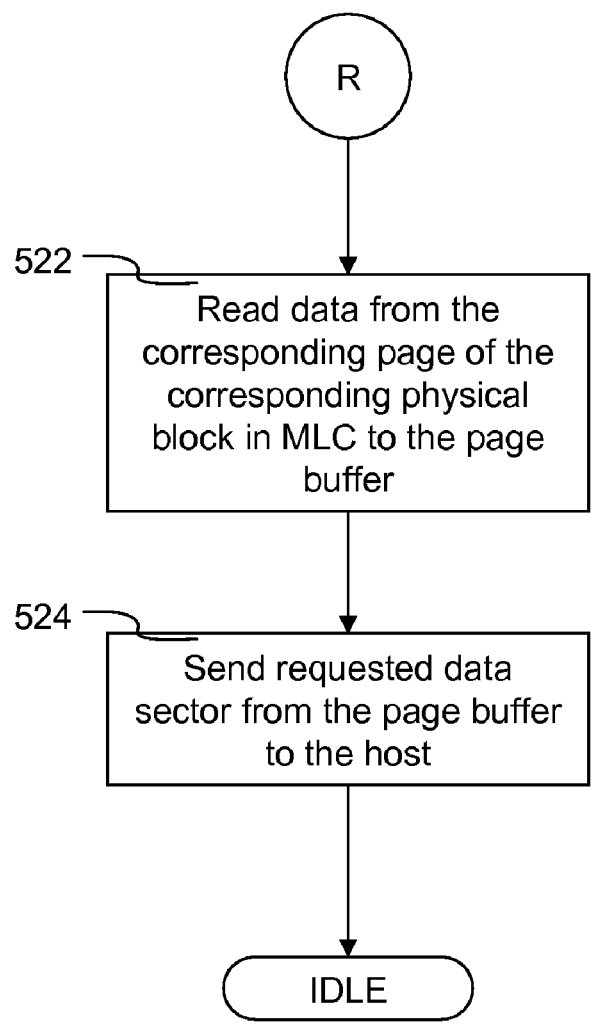

Next, at decision 518, if the data transfer request is a data read request, the process 500 continues with a sub-process 520 shown in FIG. 5B. The process 500 or sub-process 520 reads data from the corresponding page of the physical block in the flash memory to the page buffer 430. The corresponding page number is derived from the received LSA, and the physical block number is obtained through the ACPUM 306 for the entry numbers at 516. Finally, the process 500 sends the requested data sector from the page buffer 430 to the host 109 before going back the 'IDLE' status waiting for another data transfer request.

If the data transfer request is a data write or program request, the process 500 continues with a sub-process 530 shown in FIG. 5C. The process 500 or sub-process 530 moves to decision 532, in which it is determined whether the contents of the page buffer 430 have been modified. If 'no', the process 500 writes received data sector into the page buffer 430 according to the sector number derived from the received LSA, and marks the corresponding sector of the sector update flags 432 to indicate valid data in that particular sector has been written in the page buffer 430 at 538. The process 500 then moves back to the 'IDLE' state waiting for another data transfer request.

If 'yes' at decision 532, the process 500 moves to decision 534. It is determined if the received data sector is in the same entry and page numbers. If 'yes', the process 500 writes the received data sector to the page buffer 430 at 538 before going to the 'IDLE'. If 'no' at decision 534, the process 500 writes the page buffer contents to the corresponding page of the physical block of the flash memory at 550. Next, the process 500 sets the ACPUM modification flag 412 to a 'modified' status at 536. Next, at 538, the process 500 writes the received data sector to the page buffer before going back to the 'IDLE' state.

Finally, in additional to managing data read and write requests, the process 500 regularly performs a background physical block recycling process so that the blocks containing only stale data can be reused later. When the process 500 is in the 'IDLE' state, it performs test 540, in which it is determined if the idle time has exceeded a predefine time period. If 'yes', the process 500 performs the background recycling process, which may include issuing a dummy data write request to force the page buffer 430 and/or modified ACPUM 306 to be written to corresponding locations of the flash memory at 542. In one embodiment, the dummy data write/program command may be issued to rewrite some of seldom touched physical blocks, for example, physical blocks used for storing user application or system program modules.

Figure 5D:
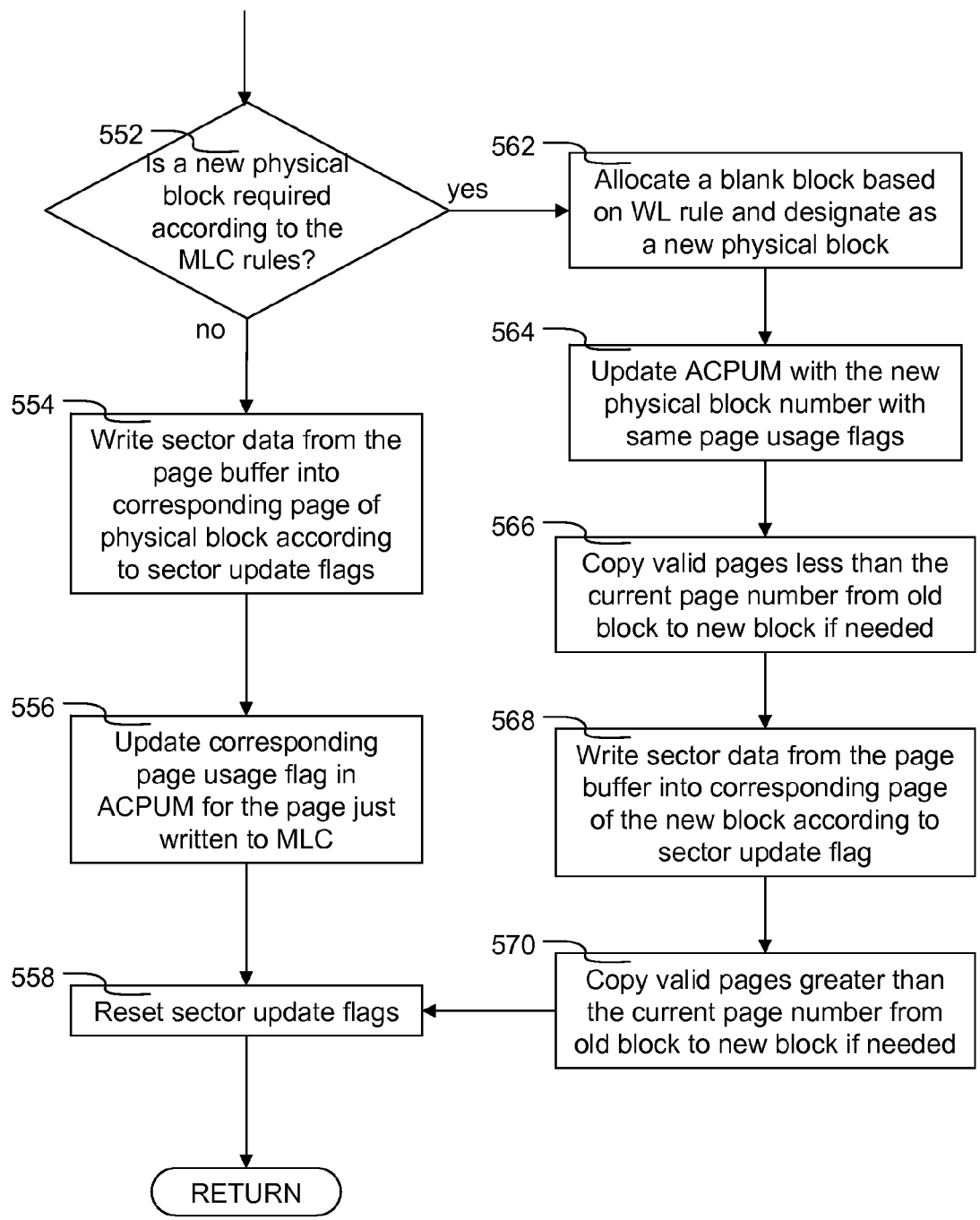

Referring to FIG. 5D, a detailed process of step 550 is shown. First, the process 500 is at decision 552, in which it is determined if a new blank physical block is required for storing the contents of the page buffer 430 based on the MLC based flash memory data programming rules. The rules are as follows: 1) each page can only be programmed once (conventionally referred to as 'NOP=1'); and 2) data programming is performed to a page of a same block in the ascending or sequential order, or each new page must have a high page number in the same block. If 'no' at decision 552, the process 500 writes valid data sectors based on the sector update flags 432 from the page buffer 430 to the page register of the corresponding page of the corresponding physical block of the flash memory at 554. Next, at 556, the process 500 updates the corresponding one of the page usage flags in the ACPUM 306 for the page just written to the flash memory. The process 500 then resets the sector update flags at 558 before returning.

If 'yes' at decision 552, the process 500 searches for a blank physical block based on the wear leveling (WL) rule; once found, the process 500 designates it as a new block at 562. Then, the process 500 updates the ACPUM 306 with the new physical block number for the entry number and keeps the page usage flags the same. It is noted that the entry number is derived from the received LSA. Next, at 566, the process 500 copies all valid pages with page number less than the current page number from the old to the new physical block if needed. The current page number if the page number derived from the received LSA. Then, the process 500 writes the valid data sectors based on the sector update flags 432 from the page buffer 430 to the page register of the corresponding page of the new physical block at 568. Finally if necessary, the process 500 copies all valid pages with page number greater than the current page number from the old to the new physical block at 570. The process 500 resets the sector update flags at 558 before returning.

Figure 5E:
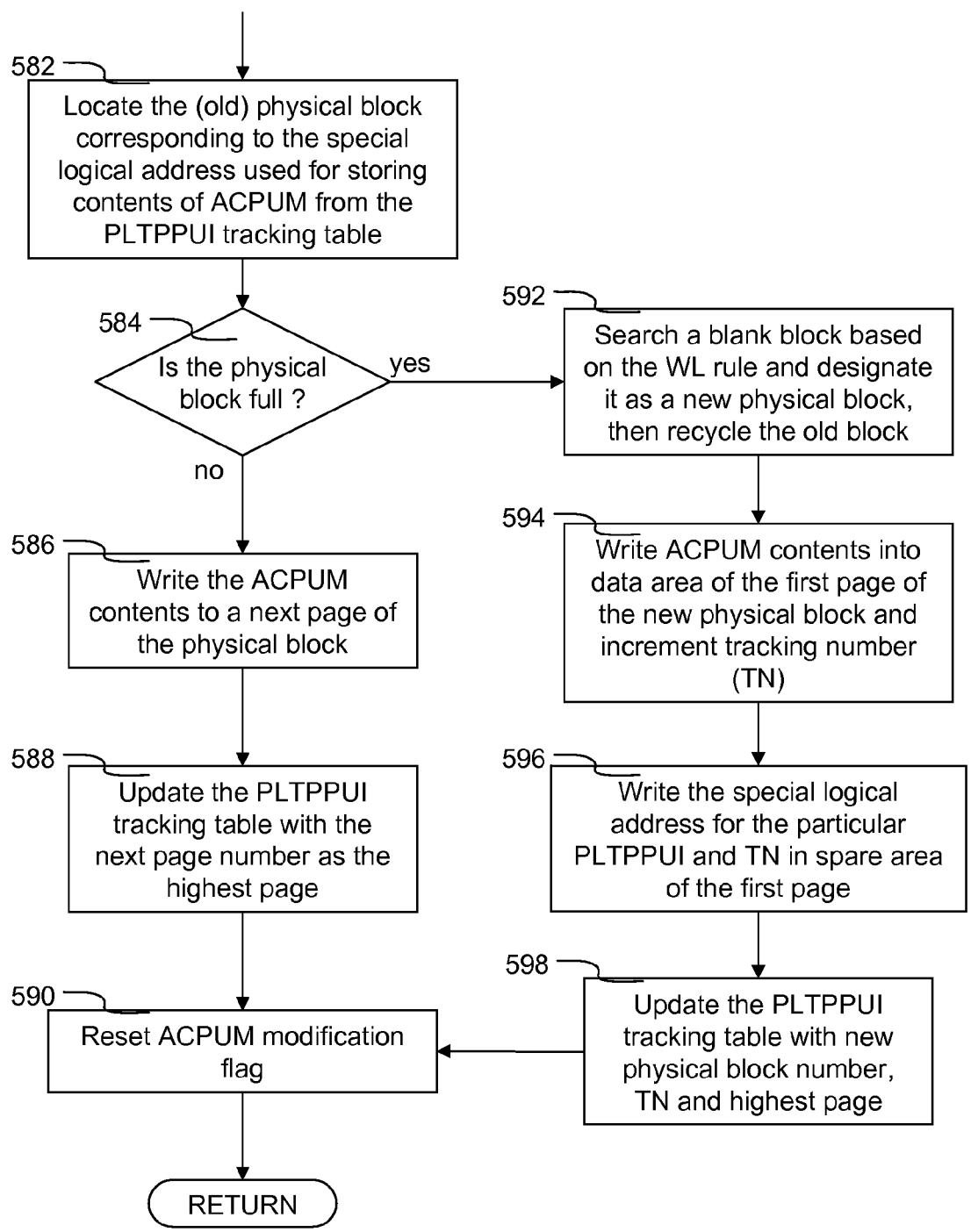

FIG. 5E is a flowchart illustrating step 580 of the process 500. First, in step 580, the process 500 locates the corresponding physical block in the reserved area of the flash memory using a particular one of the first special logical addresses from the PLTPPUI tracking table 308. The corresponding physical block is configured to store the contents of the current ACPUM 306, which is associated with the first special logical address, for example, '0xFFFF0000' for 'PLTPPUI0', '0xFFFF0001' for 'PLTPPUI1', etc. Next, at decision 584, it is determined whether the physical block is full or not. If 'no', the process 500 writes the contents of the ACPUM 306 to the next page in the physical block at 586. It is noted that the MLC based flash memory data programming rule dictates that only a new higher page in the same block is allowed to be programmed or written. Then the process 500 updates the PLTPPUI tracking table 308 to reflect that a new page has been written into the physical block by incrementing the highest page count 448 at 588. Finally, before returning at 590, the process 500 resets the ACPUM modification flag 412 to a 'not modified' status as the contents of the ACPUM 306 have been stored to the flash memory.

Referring back to decision 584, if 'yes', the process 500 searches a blank physical block as a new physical block (e.g., new physical block (PBK#1012) in FIG. 4C) in the reserved area of the flash memory based on the WL rule, and the old physical block (e.g. old physical block (PBK#1000) in FIG. 4C) is sent to a recycling queue for reuse at 592. Next, at 594, the process 500 writes the contents of the ACPUM 306 to the first page (e.g., 'P0' of FIG. 4C) of the new block. After the contents of the ACPUM have been stored in to the data area of the first page, the tracking number (TN) is incremented by one. Next, at 596, the first special logical address for this particular set of PTLPPUI and the new tracking number (TN) are written into the spare area of the first page. The process 500 then updates the PLTPPUI tracking table 308 with the new physical block number, the tracking number and the highest page number for the current set of PLTPPUI at 598. Before returning, the process 500 resets the ACPUM modification flag 412 to a 'not modified' status at 590.

FIGS. 6A-6D collectively show a sequence of data write or program requests to demonstrate the exemplary process 500 of FIGS. 5A-5E. In order to simplify the drawings and description, the sequence of the data write requests is perform on an exemplary flash memory with four sectors per page, four pages per block, and four entries per set. As a result of the simplified assumption, the logical sector address (LSA) 602 received along with the data write request can be processed in a scheme corresponding to Table 1. In other words, two least significant bits of the LSA represent the sector number, next two the page number, next two the entry number, and the remaining bits the set number.

The sequence of the data write requests starts with (a) writing to LSA=0, which corresponds to set 0 (i.e., PLTPPUI0), entry 0, page 0 and sector 0. PLTPPUI0 is loaded into ACUPUM 604, in which the first entry (i.e., entry 0) corresponds to physical block 'PBK#2' and page usage flags 606 are not set. The ACPUMF 614 is set to a 'unmodified' status. The sector data (S0) is written to the first sector of the page buffer 610 and the corresponding flag in the sector update flags 612 is set to a 'V' for valid data. The corresponding path in the process 500 for writing LSA=0 is as follows:
 (1) receiving an LSA=0 and extracting set, entry, page and set numbers at 502;
 (2) determining whether ACPUM contains a current set of PLTPPUI at 504 (yes, PLTPPUI0);
 (3) reading physical block number (PBK#2) at entry 0 at 516;
 (4) determining data transfer request type at 518 (write);
 (5) determining whether page buffer contents have been modified at 532 (no);
 (6) writing received data sector (S0) into the page buffer and marking corresponding sector ($1^{st}$) update flag at 538; and
 (7) going back to 'IDLE' for next data transfer request.

The next data write request (b) is to write to LSA=1. The corresponding path is the process 500 is as follows:
 (1) receiving an LSA=1 and extracting set, entry, page and set numbers at 502;
 (2) determining whether ACPUM contains a current set of PLTPPUI at 504 (yes, PLTPPUI0);
 (3) reading physical block number (PBK#2) at entry 0 at 516;
 (4) determining data transfer request type at 518 (write);
 (5) determining whether page buffer contents have been modified at 532 (yes);
 (6) determining whether page and block number current at 534 (yes);
 (7) writing received data sector (S1) into page buffer and marking corresponding sector ($2^{nd}$) update flag at 538; and
 (8) going back to 'IDLE' for next data transfer request.

Figure 6A:
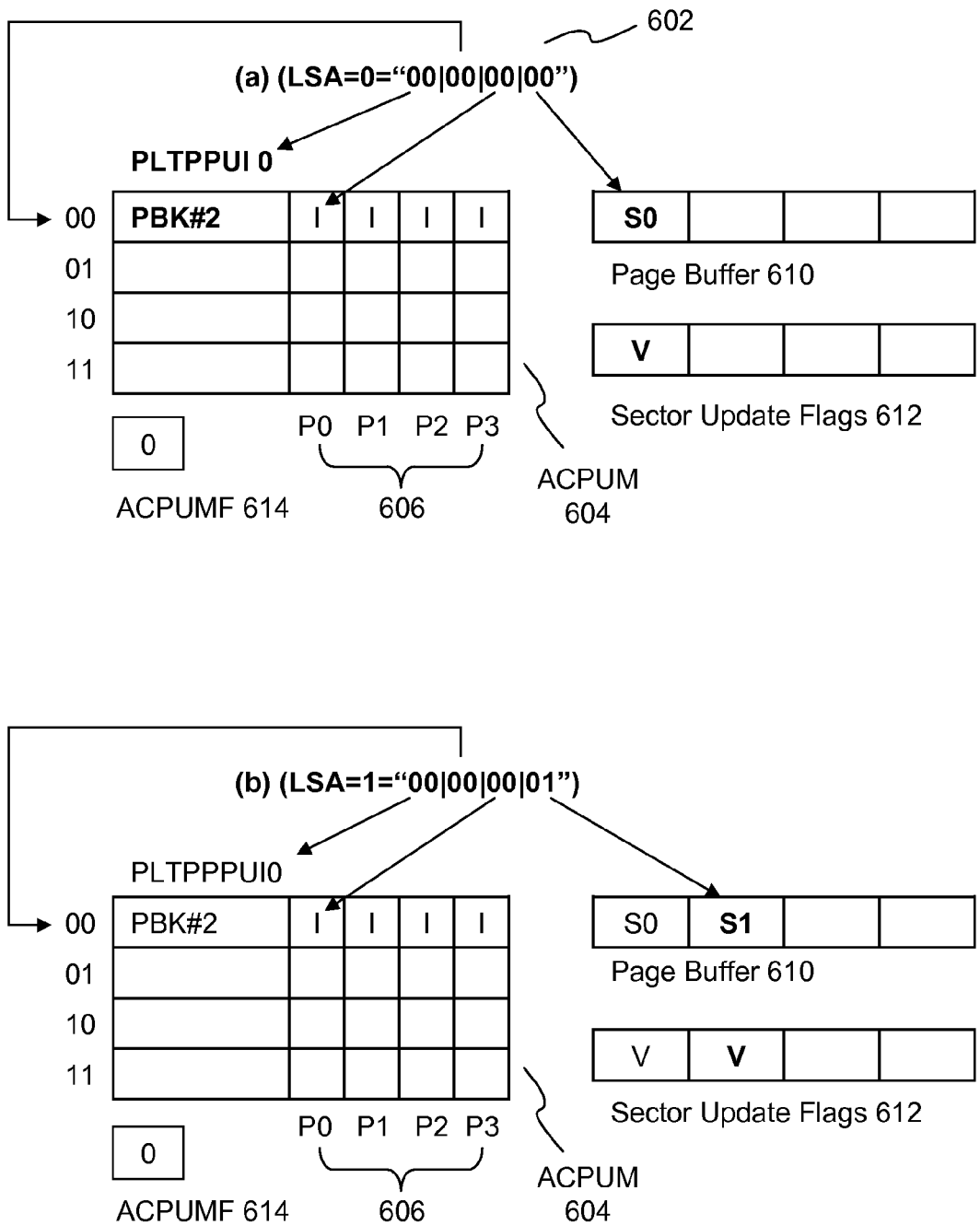
FIGS. 6A-6E collectively show a sequence of data write requests to demonstrate the exemplary process 500 of FIGS. 5A-5E.
Figure 6B:
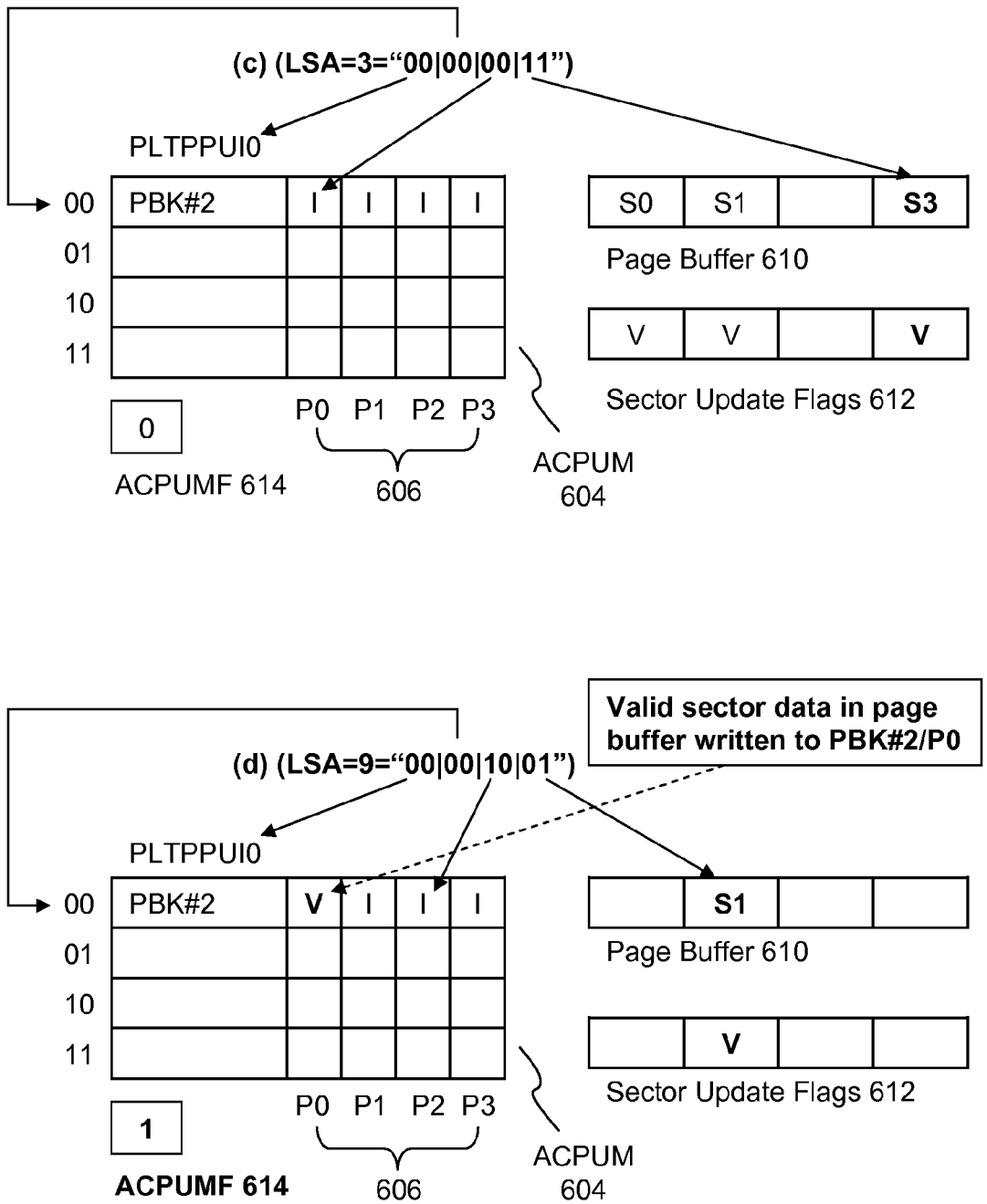

The next data write request (c) is to write to LSA=3 (FIG. 6B). The corresponding path is the process 500 is as follows:
 (1) receiving an LSA=3 and extracting set, entry, page and set numbers at 502;
 (2) determining whether ACPUM contains a current set of PLTPPUI at 504 (yes, PLTPPUI0);
 (3) reading physical block number (PBK#2) at entry 0 at 516;
 (4) determining data transfer request type at 518 (write);
 (5) determining whether page buffer contents have been modified at 532 (yes);
 (6) determining whether page and block number current at 534 (yes);
 (7) writing received data sector (S3) into the page buffer and marking corresponding sector ($4^{th}$) update flag at 538; and
 (8) going back to 'IDLE' for next data transfer request.

The next data write request (d) is to write to LSA=9 (FIG. 6B). The corresponding path is the process 500 is as follows:
(1) receiving an LSA=9 and extracting set, entry, page and set numbers at 502;
(2) determining whether ACPUM contains a current set of PLTPPUI at 504 (yes, PLTPPUI0);
(3) reading physical block number (PBK#2) at entry 0 at 516;
(4) determining data transfer request type at 518 (write);
(5) determining whether page buffer contents have been modified at 532 (yes);
(6) determining whether page and block number current at 534 (no, same block but different page);
(7) writing the page buffer contents to the corresponding page (first page of PBK#2) at 550, which includes determining a new block is required at 552 (no); writing sector data to the first page of PBK#2 at 554; updating at the corresponding page usage flag (P0) in ACPUM at 556 and resetting sector update flags at 558;
(8) setting the ACPUMF (i.e., 1 for 'modified') at 536; and
(9) writing received data sector (S1) into the page buffer and marking corresponding sector ($2^{nd}$) update flag at 538 before going back to "IDLE".

Figure 6C:
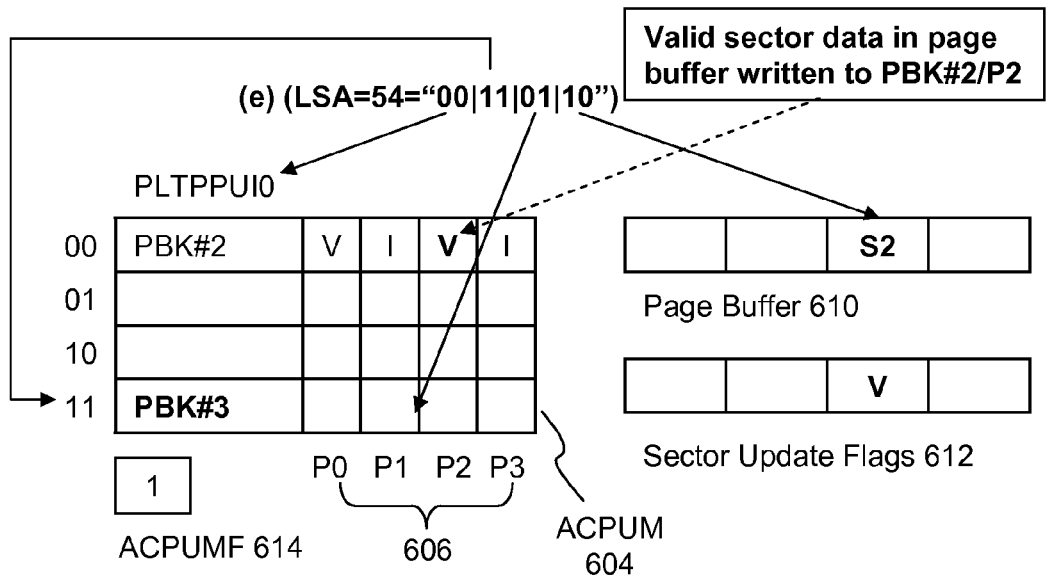

The next data write request (e) is to write to LSA=54 (FIG. 6C). The corresponding path is the process 500 is as follows:
(1) receiving an LSA=54 and extracting set, entry, page and set numbers at 502;
(2) determining whether ACPUM contains a current set of PLTPPUI at 504 (yes, PLTPPUI0);
(3) reading physical block number (PBK#3) at entry 3 (i.e., binary '11') at 516;
(4) determining data transfer request type at 518 (write);
(5) determining whether page buffer contents have been modified at 532 (yes);
(6) determining whether page and block number current at 534 (no, different block);
(7) writing the page buffer contents to the corresponding page (third page of PBK#2) at 550, which includes determining a new block is required at 552; writing sector data to the third page of PBK#2 at 554 (no); updating at the corresponding page usage flag (P2) in ACPUM at 556 and resetting sector update flags at 558;
(8) setting the ACPUMF (i.e., 1 for 'modified') at 536; and
(9) writing received data sector (S2) into the page buffer and marking corresponding sector ($3^{rd}$) update flag at 538 before going back to "IDLE".

Figure 6D:
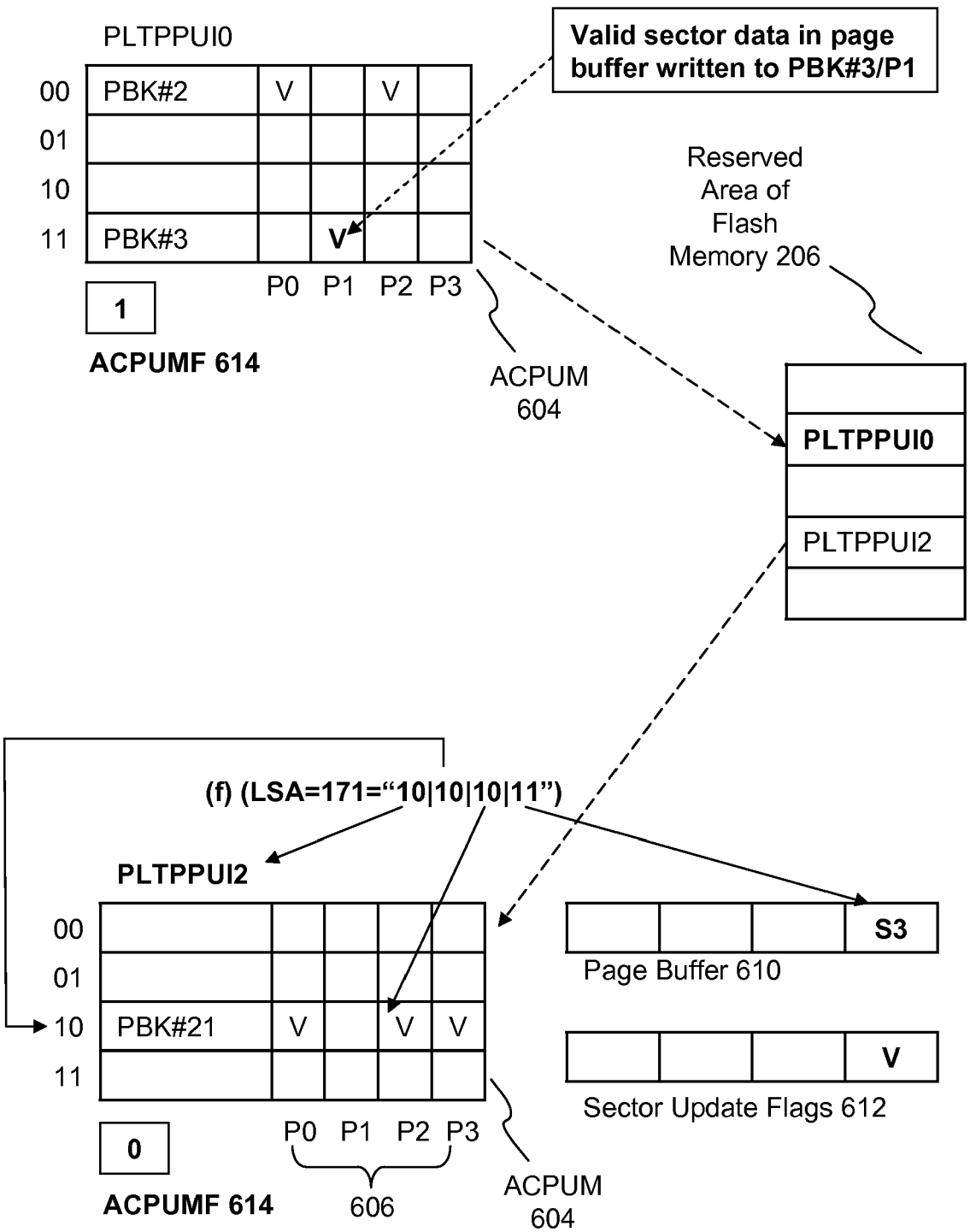

Finally, the next data write request (f) is to write to LSA=171 (FIG. 6D). The corresponding path is the process 500 is as follows:
(1) receiving an LSA=171 and extracting set, entry, page and set numbers at 502;
(2) determining whether ACPUM contains a current set of PLTPPUI at 504 (no, PLTPPUI0 does not match PLTPPUI2);
(3) determining whether the page buffer contents need to be stored at 506 (yes);
(4) writing the page buffer contents to the corresponding page (second page of PBK#3) at 550, which includes determining a new block is required at 552; writing sector data to the second page of PBK#3 at 554; updating at the corresponding page usage flag (P1) in ACPUM at 556 and resetting sector update flags at 558 and setting the ACPUMF (i.e., 1 for 'modified') at 508; (shown in upper half of FIG. 6D)
(5) determining whether ACPUM has bee modified at 510 (yes);
(6) writing the ACPUM contents to corresponding physical block corresponding to the first special logical address for particular one of the N sets of PLTPPUI (PLTPPUI0), which includes locating the physical block from the PLTPPUI tracking table at 582; determining if the physical block is full at 584 (no); writing the ACPUM contents to a next page in the physical block at 586; updating the PTLPPUI tracking table with the next page number as the highest page number at 588; and resetting the ACPUMF at 590 (i.e., 0 for 'un-modified');
(7) loading a corresponding set of PLTPPUI (PLTPPUI2) from MLC to ACPUM at 514;
(8) reading physical block number (PBK#21) at entry 2 (i.e., binary '10') at 516;
(9) determining data transfer request type at 518 (write);
(10) determining whether page buffer contents have been modified at 532 (no);
(11) writing received data sector into the page buffer ad marks the corresponding one of the sector update flags at 538 before going back to the 'IDLE' state;
(12) determining whether the 'IDLE' time has exceeded a predefined period at 540 (yes); and
(13) performing background recycling of old blocks with stale data and writing the modified page buffer and ACPUM to MLC at 542 (more details in FIG. 6E).

Figure 6E:
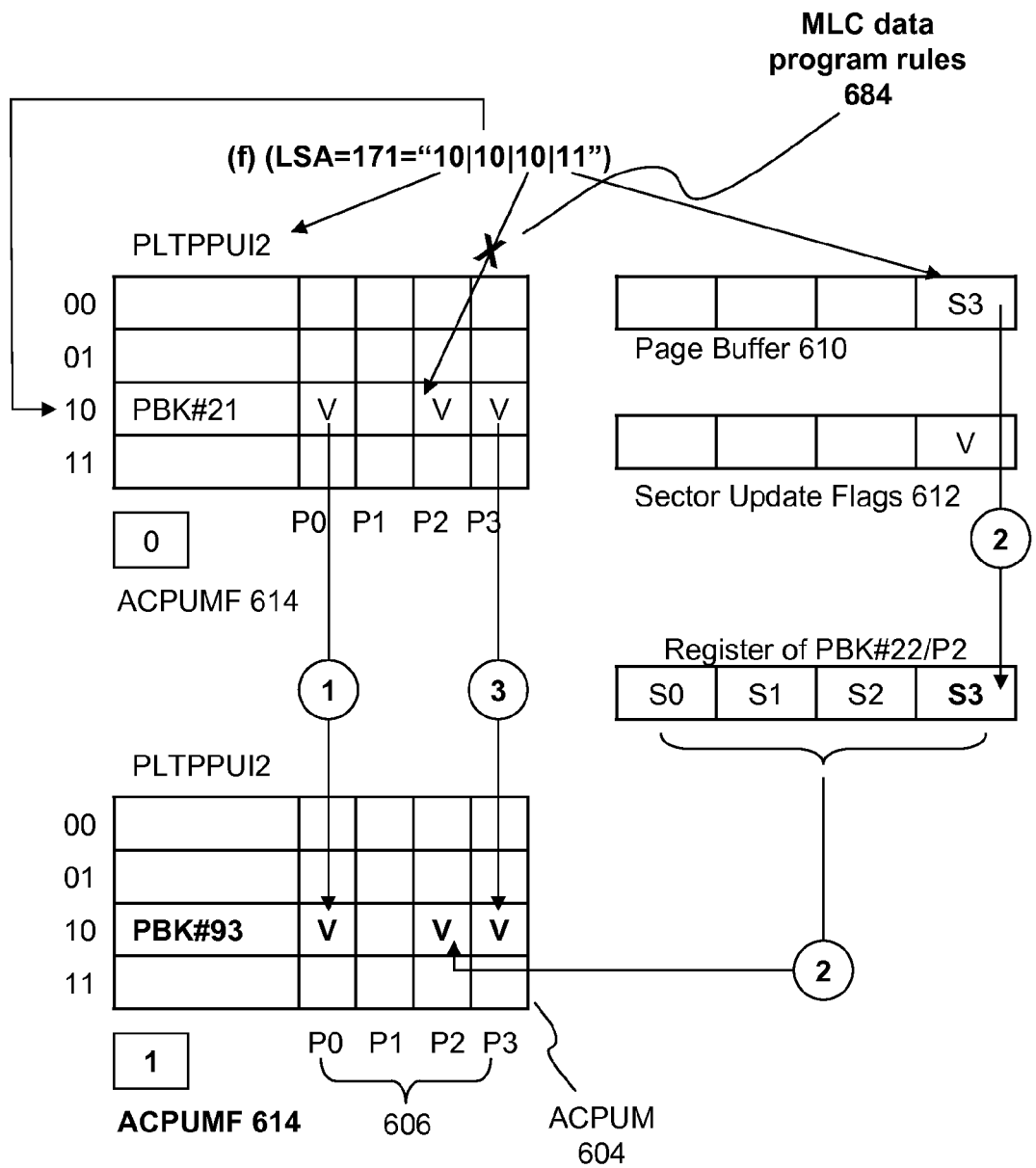

FIG. 6E is a diagram showing a complicated data program or write involving a physical block containing data that prevents another data program operation directly in accordance with the MLC data programming rules. Using the sequence of data write requests shown in FIGS. 6A-6D, after the final data write request (f) has been completed. Both the page buffer 610 and ACPUM 604 have been modified, but yet to be stored in the flash memory. Due to data already existed in certain pages of the physical block (i.e. PBK#21), the MLC data program rules 684 prevent the modified page buffer 610 be written to PBK#21. A new blank block (i.e., PBK#93) is allocated and assigned to hold the data in the old block (PBK#21) including updates from the modified page buffer 610. The corresponding path in the step 550 of the process 500 is as follows:
(1) determining a new physical block is required according to the MLC rules at 552 (yes);
(2) allocating and assigning a new block based on the wear leveling rule at 554;
(3) updating the ACPUM 604 with the new block number (PBK#93) and same page usage flags at 564;
(4) if required, copying the valid pages with page number smaller than the current page number (i.e., P2 or $3^{rd}$ page derived from LSA) from the old block (PBK#21) to the new block PBK#93) at 566 (see STEP 1 in circle in FIG. 6E);
(5) writing sector data (S3) from the page buffer to the register of the corresponding page of PBK#93 and thus updating the page in PBK#93 at 568 (see STEP 2 in circle in FIG. 6E);
(6) if required, copying the valid pages with page number greater than the current page number (i.e., P2 or $3^{rd}$ page derived from LSA) from the old block PBK#21) to the new block PBK#93) at 570 (see STEP 3 in circle in FIG. 6E); and
(7) resetting the sector update flags at 558 before following the remaining data write steps of the process 500.

Referring now to FIGS. 7A-7E, which collectively are a flowchart illustrating an exemplary process 700 of initialization of a large capacity flash memory device in accordance with one embodiment of the present invention. The process 700 starts with a power up, for example, a flash memory device is plugged into a host 109. Next, the process 700 recreates the PLTPPUI tracking table 308 of FIG. 3 from stored N sets of PLTPPUI in the reserved area of the flash memory at 710. Then the process 700 validates the stored wear leveling and error correction code information with actual state of all of the physical blocks at steps 730 and 750, respectively. At 770, the process 700 verifies and validates the store PLTPPUI records against actual state of the physical blocks associated with a plurality of first special logical addresses. Finally, the process loads one of the N sets of PLTPPUI into ACPUM 306 at 790 before the initialization ends. The details of steps 710, 730, 750 and 770 are shown and described in respective FIGS. 7B, 7C, 7D and 7E.

Figure 7A:
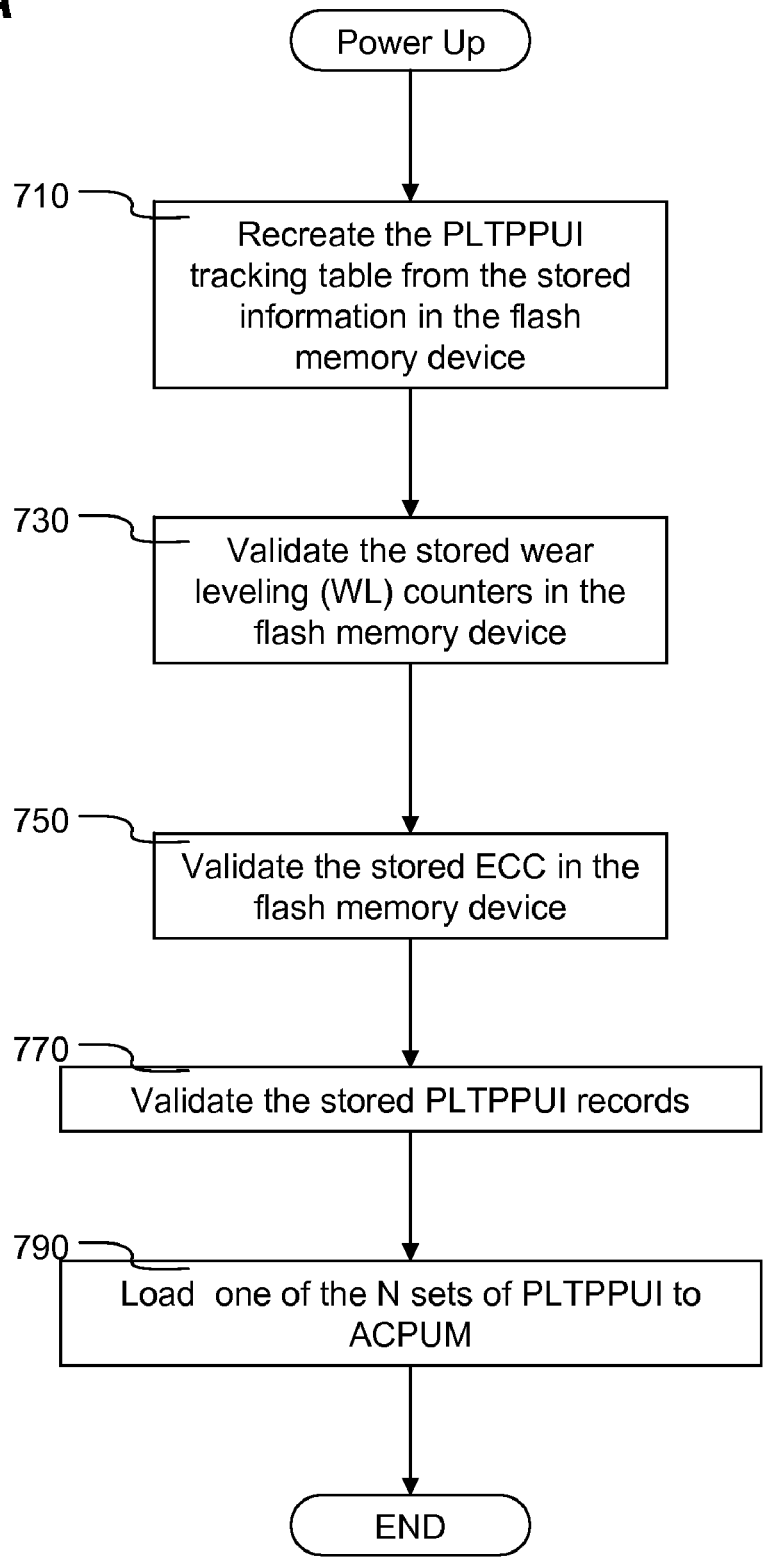
FIGS. 7A-7E collectively are a flowchart illustrating an exemplary process of initialization of a large capacity flash memory device in accordance with one embodiment of the present invention.
Figure 7B:
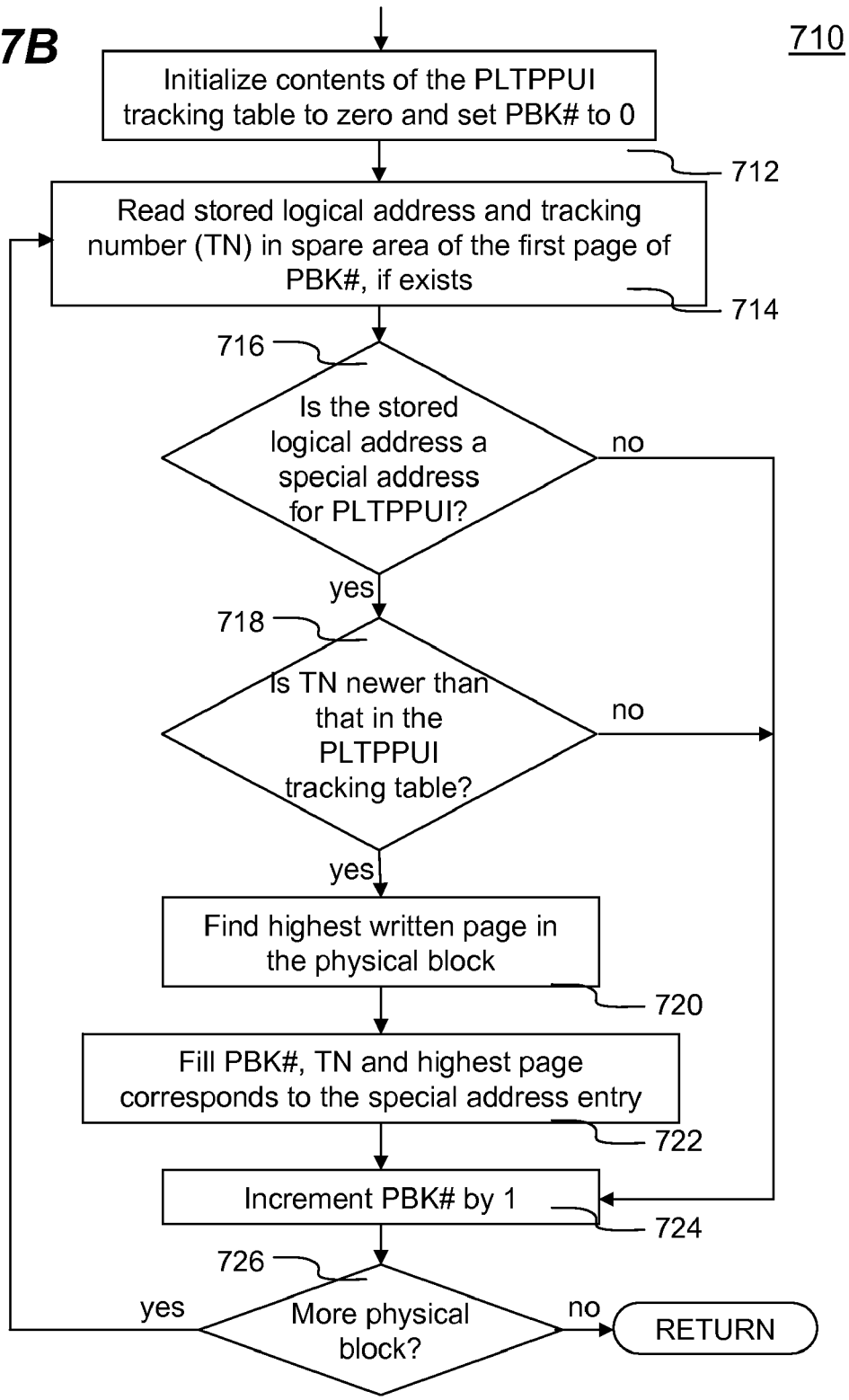

Shown in FIG. 7B, the process 700 initializes contents of the PLTPPUI tracking table 308 to zero and a physical block counter (PBK#) to 0 at 712. Next, the process 700 reads stored logical address and tracking number (TN) in the spare area of the first page of the physical block 'PBK#' at 714. Then the process 700 moves to decision 716, in which it is determined whether the stored logical address is one of the first special addresses for storing PLTPPUI issued by the FW and microcontroller. If 'no', the process 700 simply skips this physical block by incrementing the physical block counter 'PBK#' by one at 724. Next if additional physical block determined at decision 726, the process 700 moves back to step 714 for processing the next physical block, otherwise the step 710 is done.

If 'yes' at the decision 716, the process 700 follows the 'yes' branch to another decision 718. It is then determined whether the stored tracking number is newer than the one listed in the PLTPPUI tracking table 308. For example, the contents in the PLTPPUI tracking table is initialized to zero, any stored tracking number (TN) greater than zero indicates that the stored records are newer. If 'no' at decision 718, the process 700 skips this physical block similar to the 'no' branch of decision 716. However, if 'yes' at decision 718, the process 700 searches and locates a highest written page in this physical block 'PBK#' at 720. Next, at 722, the process 700 writes the 'PBK#', TN and highest page number in the PLTPPUI tracking table corresponding to the first special logical address. Finally, the process 700 increments the physical block count 'PBK#' by one at 724, then moves to decision 726 to determine either moving back to 714 for processing another physical block or ending the step 710.

Figure 7C:
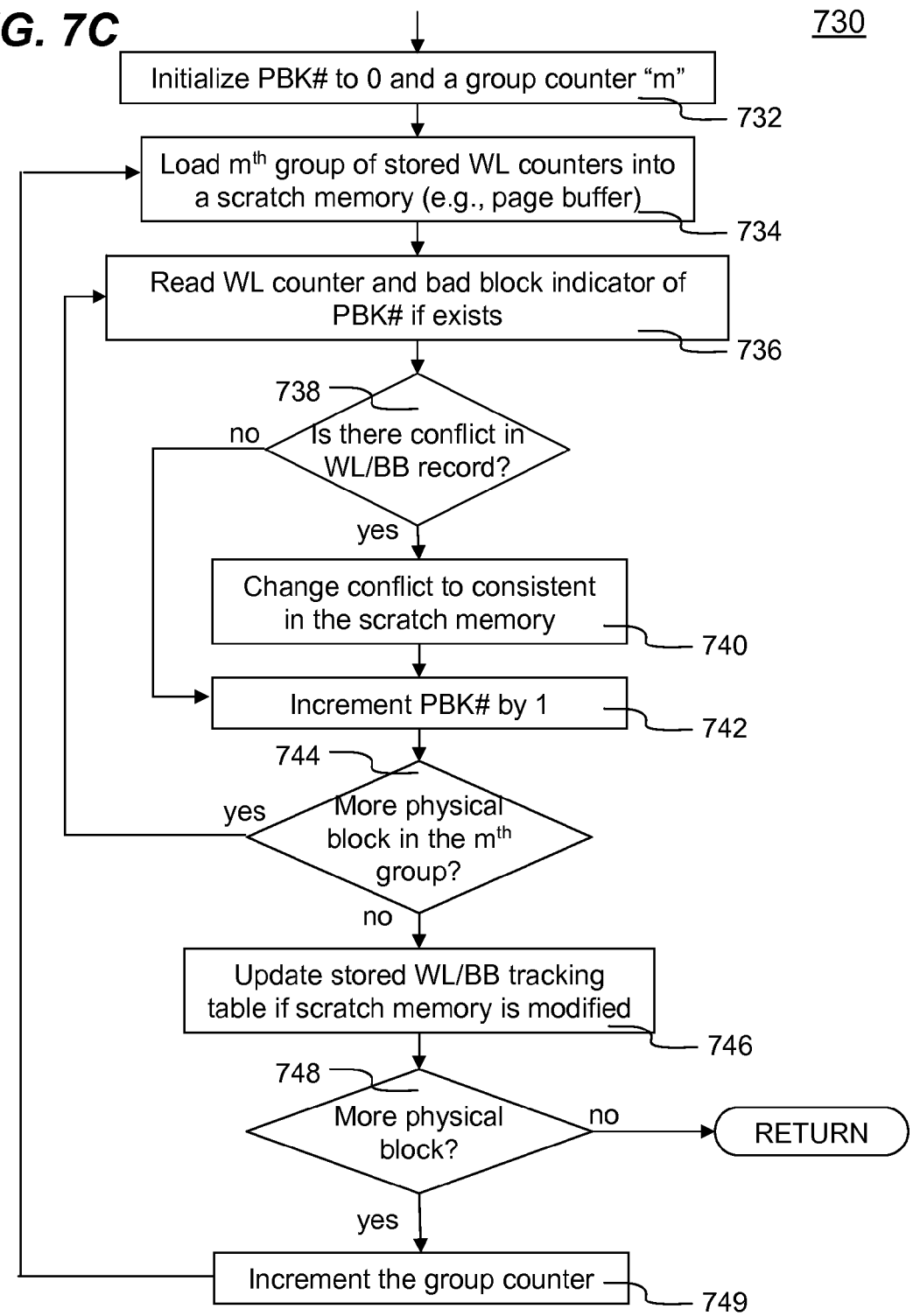

Details of step 730 are shown in FIG. 7C. At 732, the process 700 initializes a physical block counter 'PBK#' and a group counter 'm' to zero. Next, the process 700 loads a 'm$^{th}$', group of stored WL/BB tracking table into a scratch memory space (e.g., the page buffer 314 of FIG. 3) at 734. Then the process 700 reads the wear leveling (WL) counter and bad block indicator for the physical block 'PBK#' at 736. The process 700 moves to decision 738, in which it is determined whether the stored information is in conflict with the physical state of 'PBK#'. If 'yes', the process 700 corrects the conflict information to be consistent with the physical state in the scratch memory at 740. If 'no' at decision 738, there is no need to correct the conflict.

Next, at 742, the physical block counter 'PBK#' is incremented by one. The process 700 moves to another decision 744, it is determined if there is additional block in the 'm$^{th}$', group. If 'yes', the process 700 goes back to step 736 reading another WL counters of another physical block to repeat the above steps until the decision 744 becomes 'no'. The process 700 updates the stored WL/BB tracking table 310 at 746. At next decision 748, it is determined if there is any more physical block. If 'yes', the process 700 increments the group counter at 749 then goes back to 734 for repeating the above steps for another group. Otherwise, the step 730 returns when the decision 748 is 'no'.

Figure 7D:
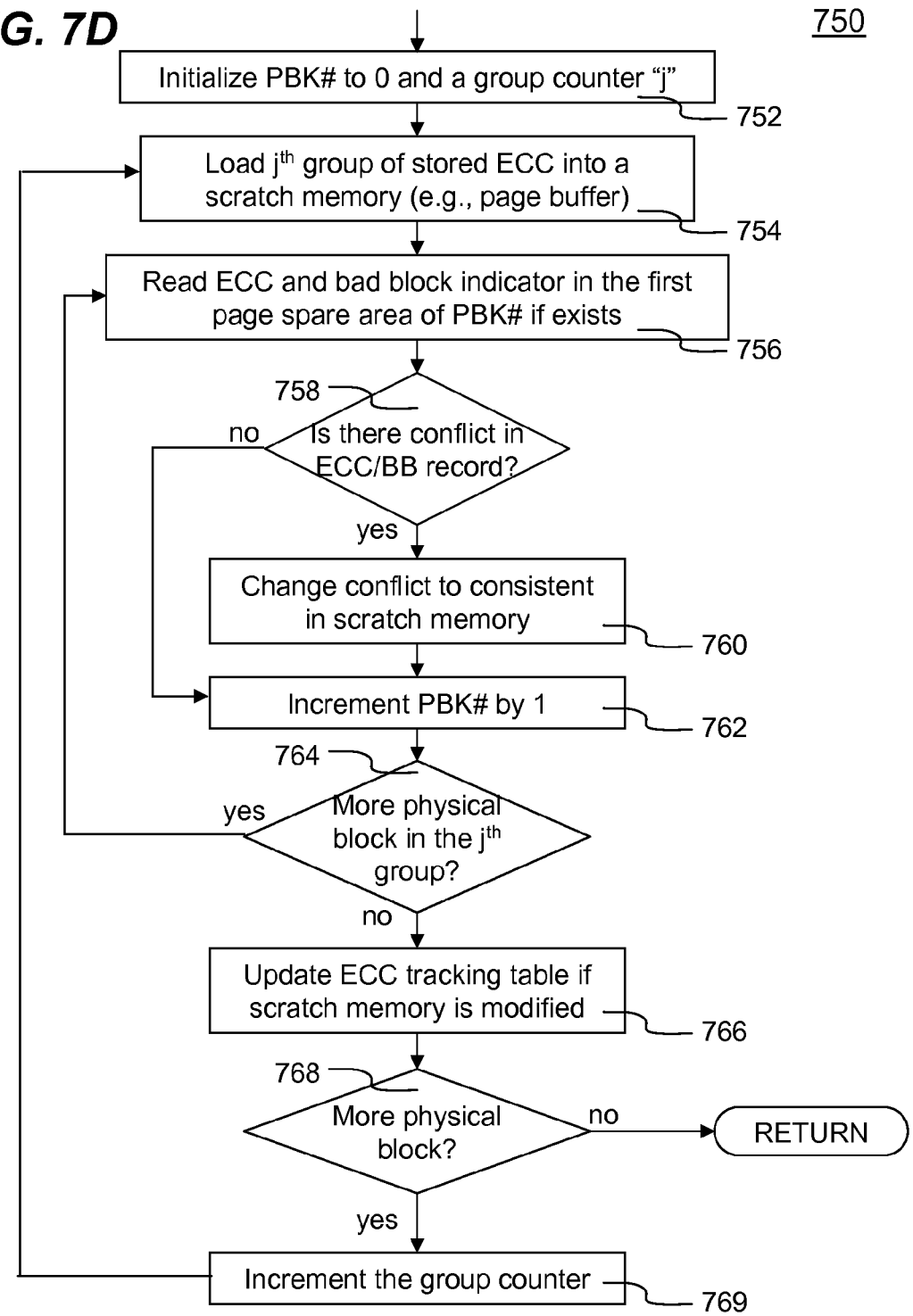

FIG. 7D shows details of step 750, which is substantially similar to the step 730. Instead of checking and correcting conflict WL/BB information, the step 750 validates and corrects the stored error correction code (ECC) for all physical blocks. The number of group is related to the size of the scratch memory. For example, a 2048-byte page buffer can provide space for holding a group of 1024 WL counters, if each of the WL counters is a 16-bit number. As to the 8-bit ECC, the same 2048-byte page buffer may hold a group of 2048 ECC codes.

Figure 7E:
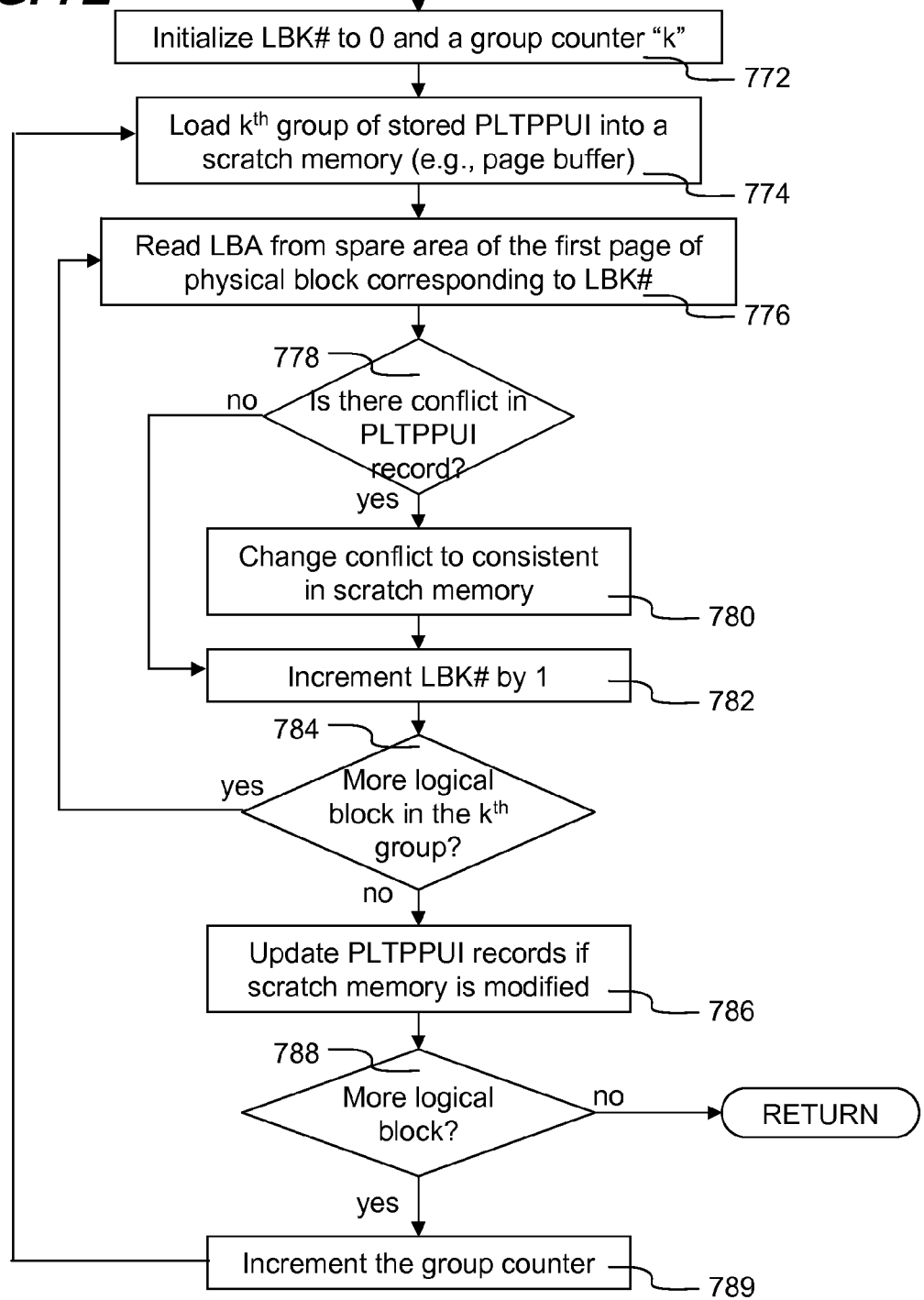

FIG. 7E shows details of step 770. At 772, the process 700 initializes a logical block counter 'LBK#' and a group counter 'k' to zero. The process 700 loads a 'k$^{th}$' group of stored PLTPPUI into a scratch memory space (e.g., a page buffer or other available memory) at 774. The process 700 reads logical block address from the spare area of the first page of a physical block corresponding to the 'LBK#' at 776. Next, at decision 778, it is determined whether there is conflict between the stored PLTPPUI and the physical page usage of the physical block. If 'yes', the conflict is corrected with the physical state in the scratch memory at 780. Otherwise, the process 700 skips step 780. Next, at 782, the process 700 increments the logical block counter 'LBK#' by one. The process 700 then moves to another decision 784, in which it is determined if there is more block in the 'k$^{th}$', group. If 'yes', the process 700 moves back the step 776 repeating the process until the decision 784 becomes 'no'. Then the process 700 updates the stored PLTPPUI records if the scratch memory has been altered at 786. Next, at decision 788, if there is more logical block, the process 700 follows the 'yes' branch to step 789 by incrementing the group counter and repeating the process from step 774 until the decision 788 becomes 'no', in which the step 770 ends.

Each entry record of PLTPPUI is 18-byte, which is a sum of 2-byte physical block number plus 128-bit (i.e., 16-byte) of page usage flags (i.e., 128 pages per block). Using 2048-byte page buffer as a scratch memory can only hold a group of 113 entry records. One may use a larger memory such as ACPUM 306 as the scratch memory, which may hold more entry records thereby reducing the initialization time.

Figure 8A:
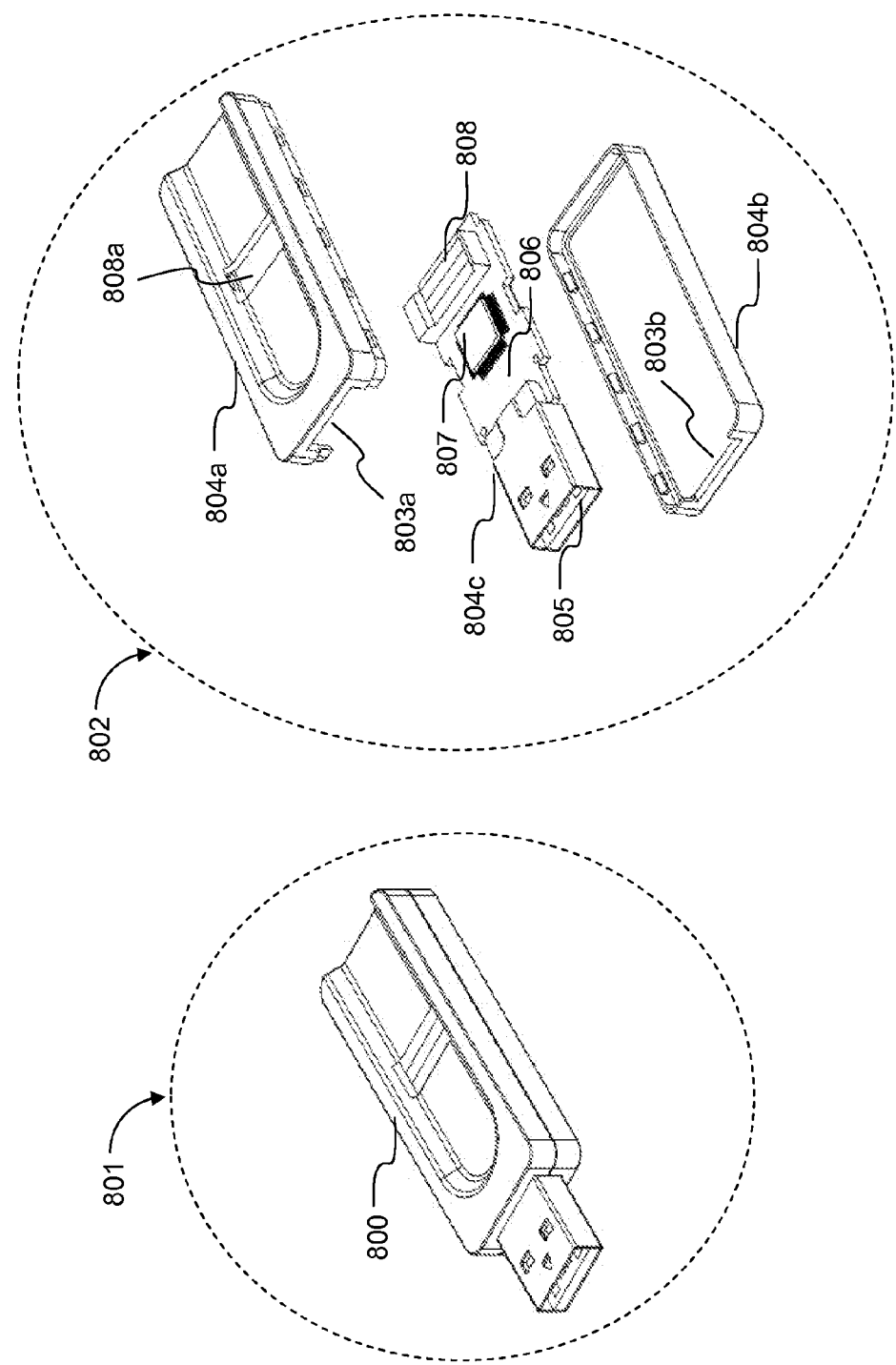
FIGS. 8A-8G are various perspective views and exploded perspective views of exemplary flash memory devices in accordance with several embodiment of the present invention.

Referring now to FIG. 8A, which shows perspective 801 and exploded perspective 802 views of an exemplary flash memory device 800 with a fingerprint sensor in accordance with one embodiment of the present invention. The perspective view 801 shows the flash memory device 800 with a fingerprint sensor that corresponds to the first flash memory device 100 of FIG. 1A or the second flash memory device 120 of FIG. 1B. The flash memory device 800 comprises a top housing 804a, a bottom housing 804b and a flash memory core unit 804c. The top housing 804a and bottom housing 804b may be attached to each other via variety of method, including using a snap together mechanism (FIG. 8F) or ultrasonic welding (FIG. 8G) around edges of top and bottom housing. The core unit 804c includes an interface connector (i.e., Universal Serial Bus (USB) plug connector 805) disposed on a printed circuit board (PCB) 806 having an MLC flash controller 807 and one or more MLC flash memory devices (not shown) mounted thereon. The USB connector 805 is coupled to the PCB 806 electrically and physically such that control signals and power can pass through. The core unit 804c further includes a fingerprint sensor 808 which may also be implemented using the techniques described above.

Further, a special design for industrial and military application on the finished assembly of the flash memory device 800 includes a conforming coating to achieve the purposes of preventing oxidation of integrated circuit leads or soldering area; covering or protecting extreme temperature exposure either cold or hot; and waterproofing for certain military or industrial applications. The procedure of applying the conforming coating to the flash memory device 800 includes: 1) putting a masking cap or tape on specific area such as connectors, switches; 2) spraying or brushing the conforming coating material (e.g., HumiSeal® 1B73); and 3) inspecting the coated area with ultraviolet (UV) lights for imperfection (e.g., bubbles, missed coating area).

PCB 806 is a medium means used for mechanically support and electrically connection of electronic components using conductive pathways, or traces, etched from copper sheets laminated onto a non-conductive substrate. The core unit 804*c* is also referred to as a print circuit board assembly (PCBA).

In addition, top surface of the top housing 804*a* comprises an indent space configured for fingerprint sensing area (i.e., space for user's finger) with a cut-out 808*a* for exposing the fingerprint sensor 808 to a user's finger. Each of the top and bottom housing 804*a-b* includes a cut out 803*a-b* to allow the USB plug connector 805 to be extended external to the housing. In this example, the MLC USB device is implemented in a PCBA package.

Figure 8B:
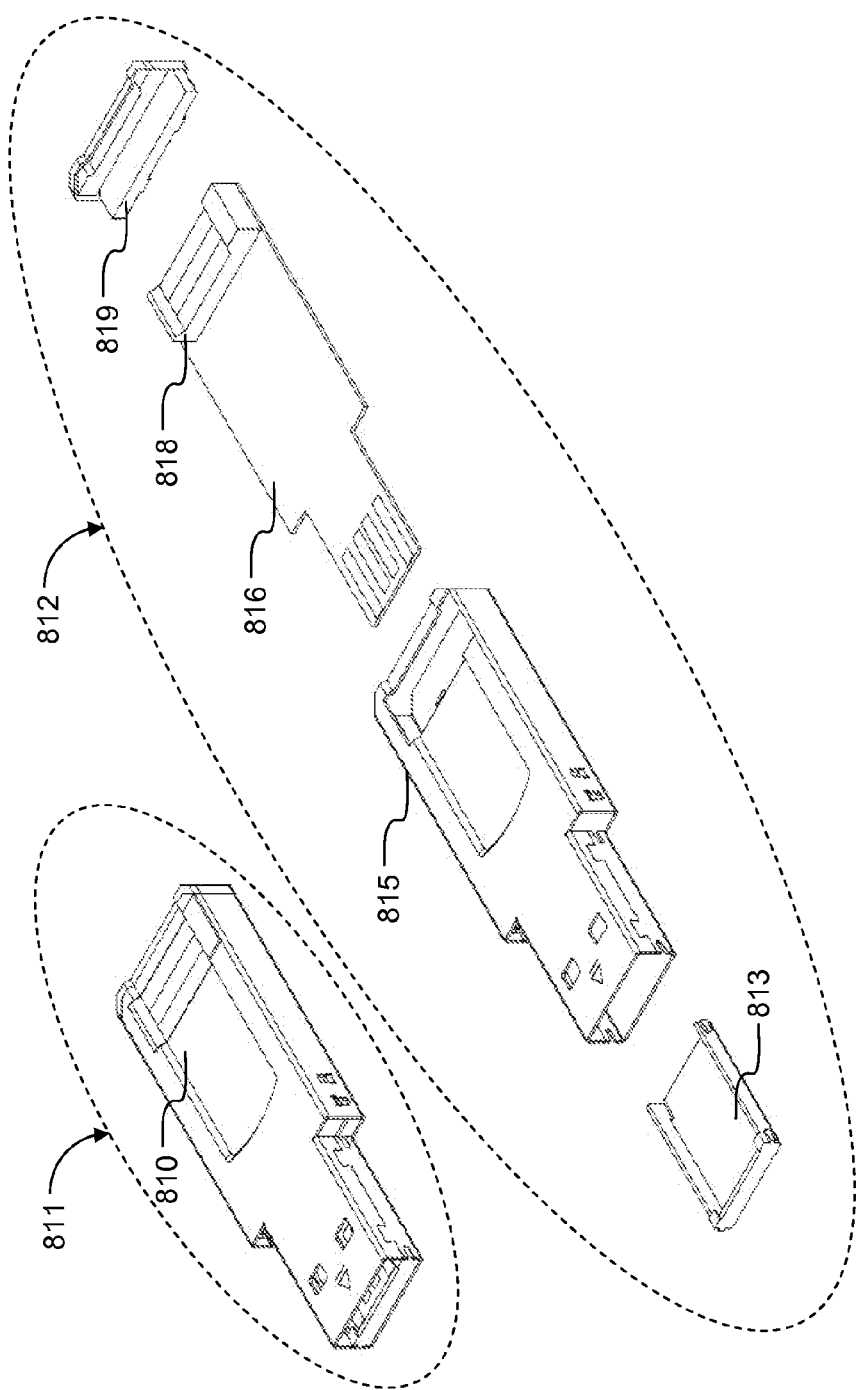

However, the flash memory device 800 could be a variety of packages such as a slim USB flash memory device 810 as shown in FIG. 8B. The slim USB flash memory device 810 is shown in a perspective view 811 and an exploded perspective view 812. The device 810 is implemented in a slim package having a housing 815 which may be implemented as a metal case. PCBA 816 having an MLC controller and MLC memory devices (not shown) with a fingerprint sensor 818 thereon may be inserted into the housing 815 and supported by a support piece 813 and enclosed by an end cap 819. The interface connector is made of a combination of the front portion of the PCBA 816, the front portion of the metal case 815 and the support piece 813.

Figure 8C:
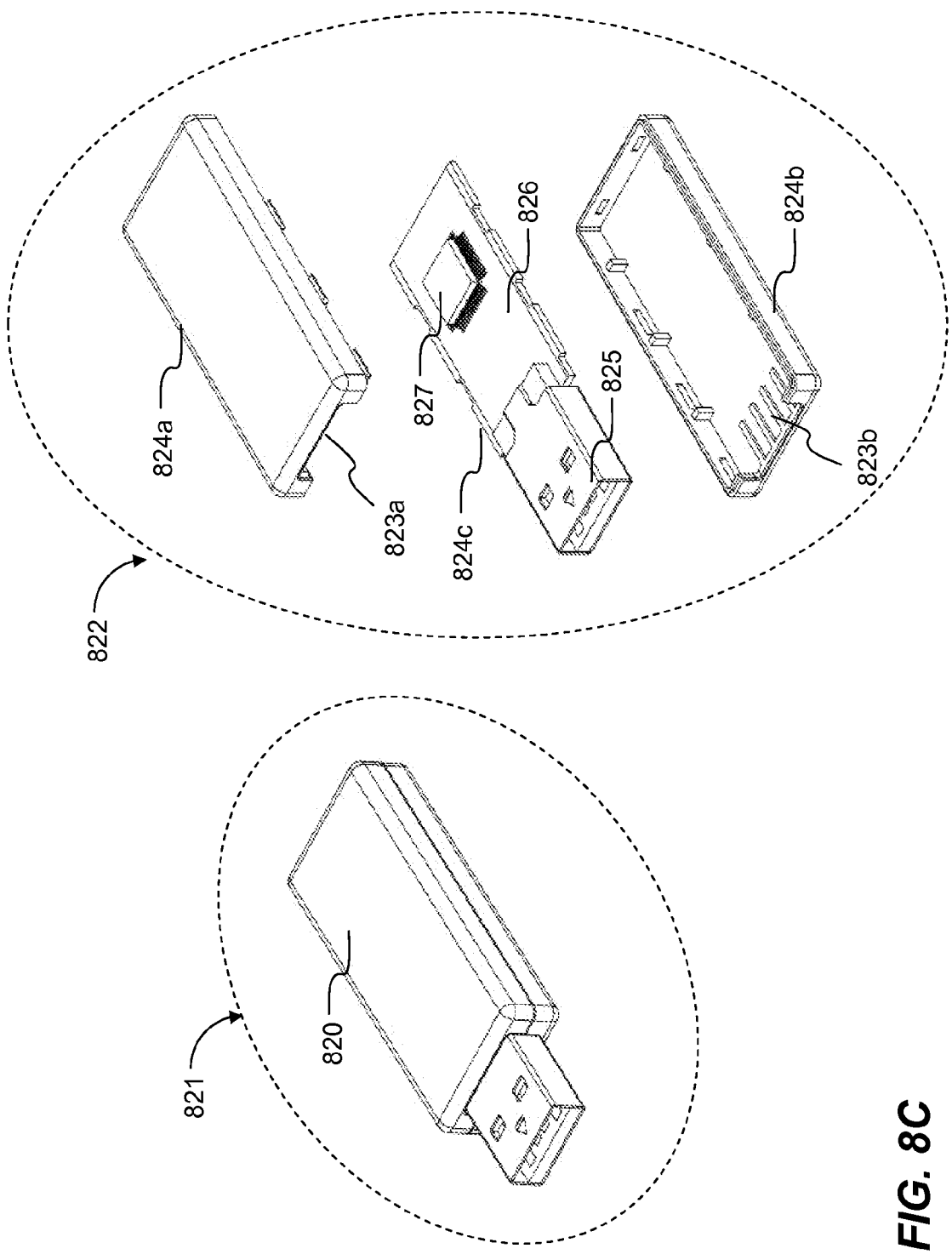

FIG. 8C shows a perspective view 821 and an exploded perspective view 822 of an alternative flash memory device 820 without a fingerprint sensor (e.g., flash memory device 140 of FIG. 1C) in another embodiment of the present invention. The flash memory device 820 comprises a top housing 824*a*, a bottom housing 824*b* and a core unit 824*c* sandwiched in between. The core unit 824*c* comprises an interface connector (i.e., USB plug connector 825), a PCB 826 with a plurality of chips mounted thereon (e.g., MLC flash controller 827, MLC flash memory chip (not shown)). Each of the top and bottom housing 824*a-b* includes a cut out 823*a-b* to allow the USB plug connector 825 to be extended external to the housing.

Figure 8D:
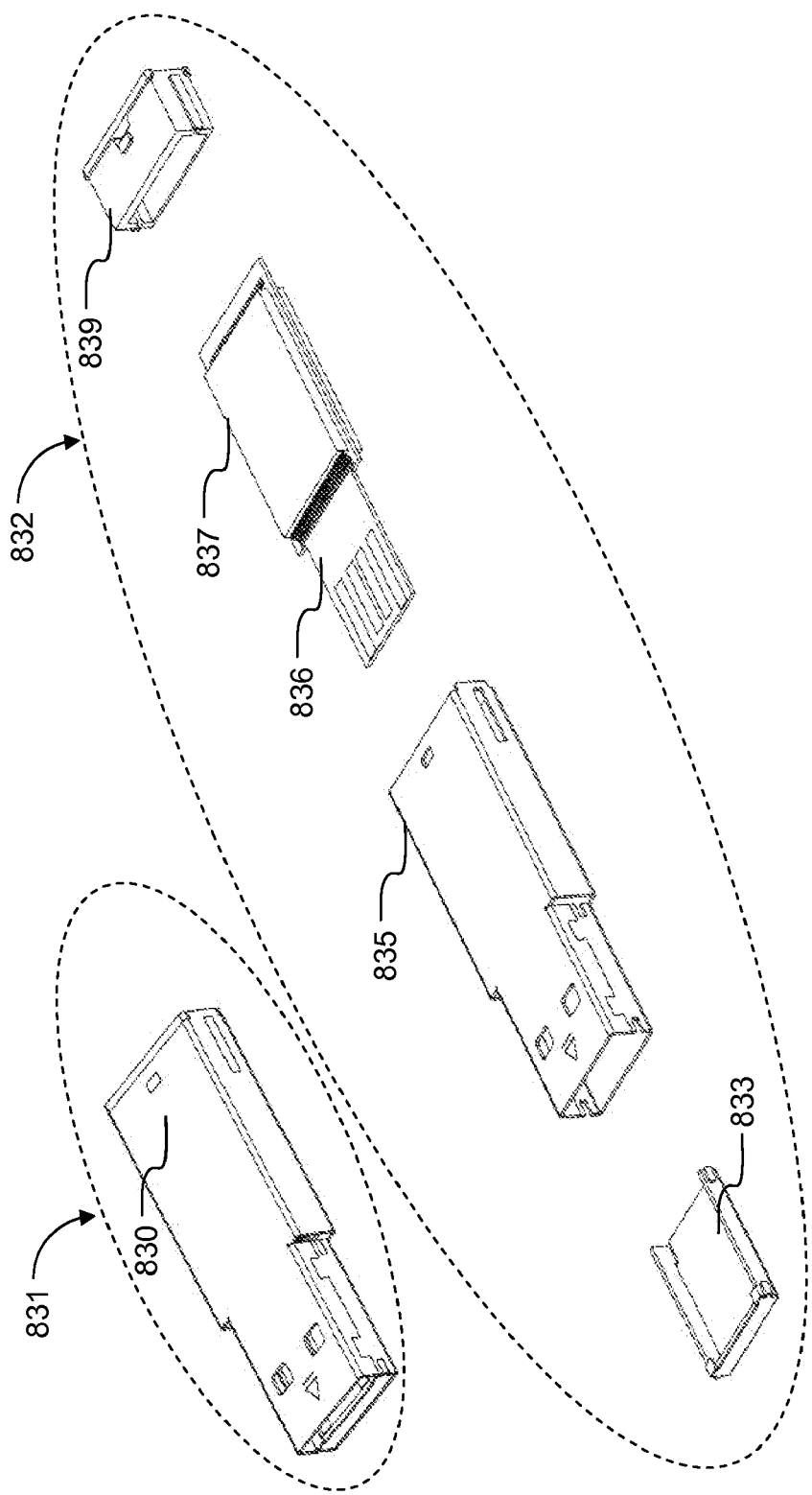

FIG. 8D shows a perspective view 831 and an exploded perspective view 832 of yet another alternative flash memory device 830 without a fingerprint sensor in accordance with one embodiment of the present invention. The flash memory device 830 comprises a housing 835 (metal or plastic), a flash memory core unit 836, an end cover piece 839 and a core unit support tray 833. The core unit 836 may be made of PCB with at least one flash memory chip and a flash memory 837 controller mounted thereon. Similar to the embodiment in FIG. 8B, the interface connector is made of a combination of the front portion of the core unit 836 with the front portion of the housing 835 and the support tray 833.

Figure 8E:
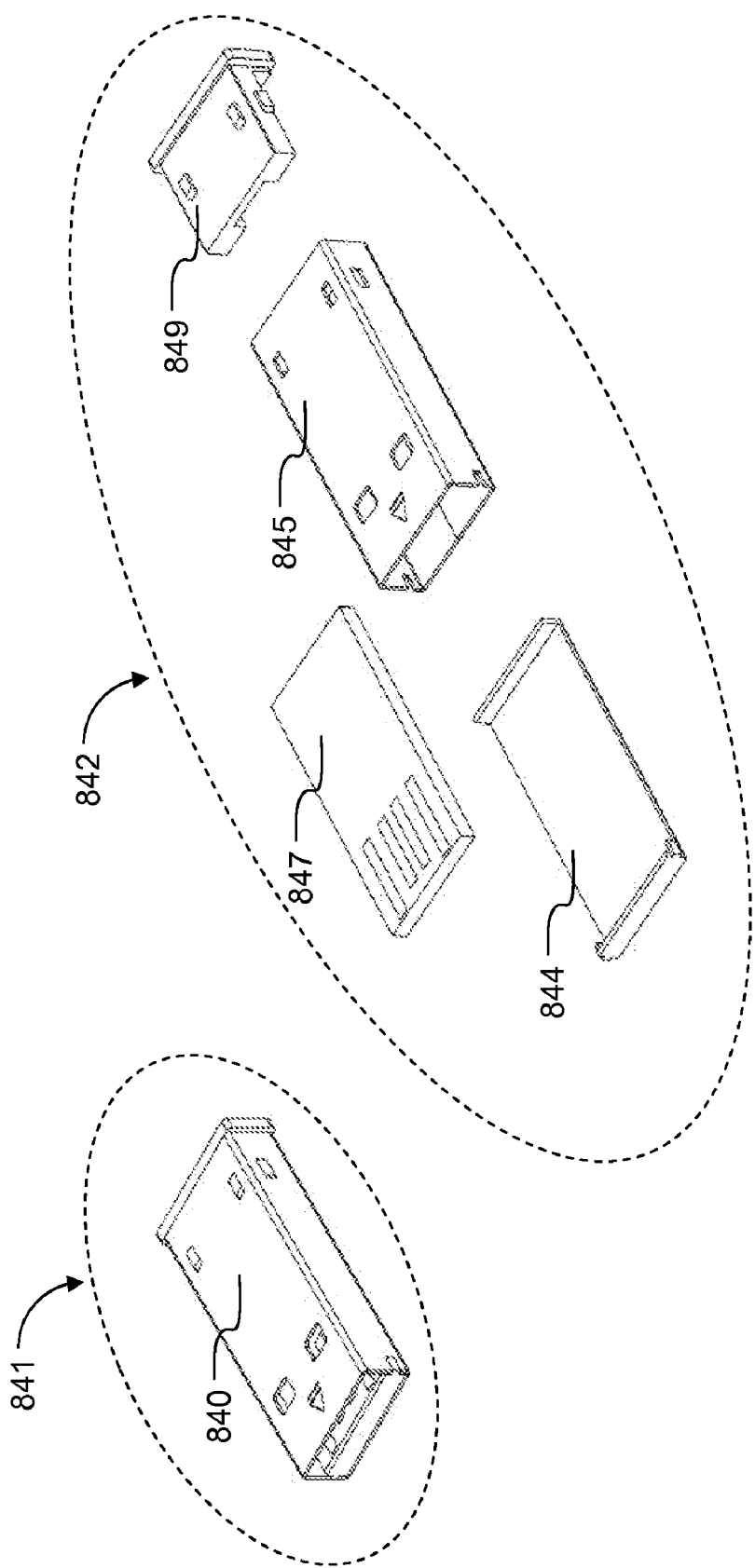

FIG. 8E shows a perspective view 841 and an exploded perspective view 842 of yet another alternative flash memory device 840 in accordance with one embodiment of the present invention. The flash memory device 840 comprises a metal casing 845, a plastic substrate carrier 844, a flash memory core unit 847 and an end cover piece 849. The flash memory core unit 847 is manufactured using Chip-on-Board (COB) technologies in which a substrate with all components (i.e., flash memory chip, controller and passive components) mounted thereon. The end cover piece 849 comprises a metal end cover plate and a plastic end plug structure. The end cover piece 849 is configured to stabilize the flash memory core unit 847 assembled on the plastic substrate carrier 844 then inside the metal casing 845. The interface connector is made of a combination of the front portion of the core unit 847 with the front portion of the metal casing 845 and the front portion of the carrier 844.

Figure 8F:
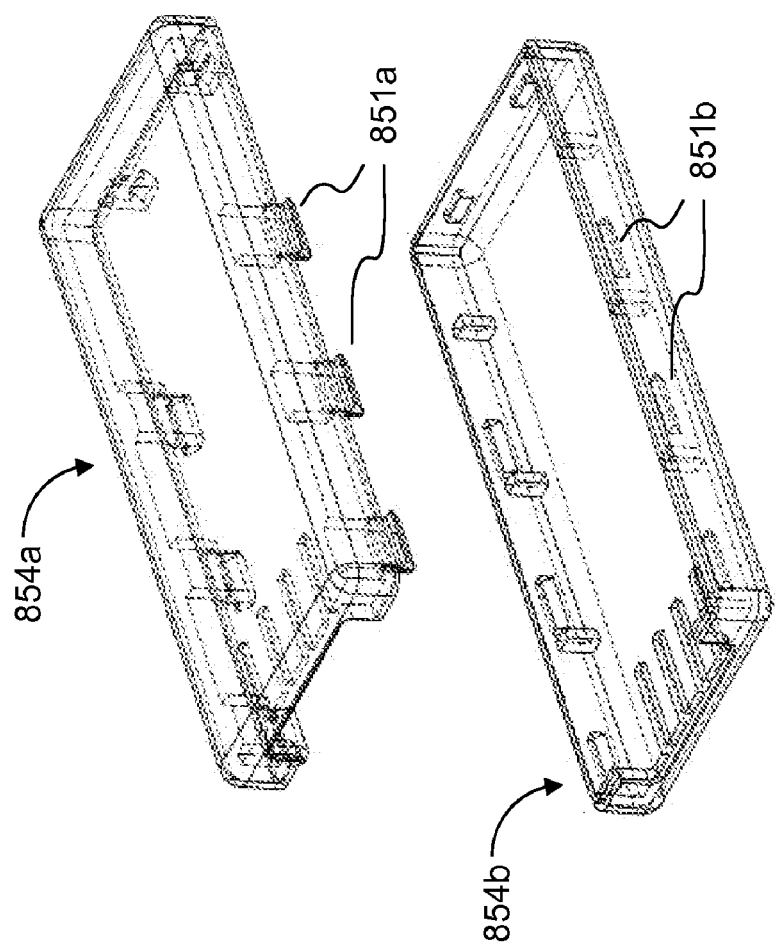

As shown in FIG. 8F, a MLC based flash memory device (not shown) may be protected by the top and bottom housing 854*a-b* joined using snap-together mechanism. Tabs 851*a* of the top housing 854*a* snap into corresponding slots 851*b* of the bottom housing 854*b* in snap-together mechanism of joining the top and bottom housing 854*a-b*.

Figure 8G:
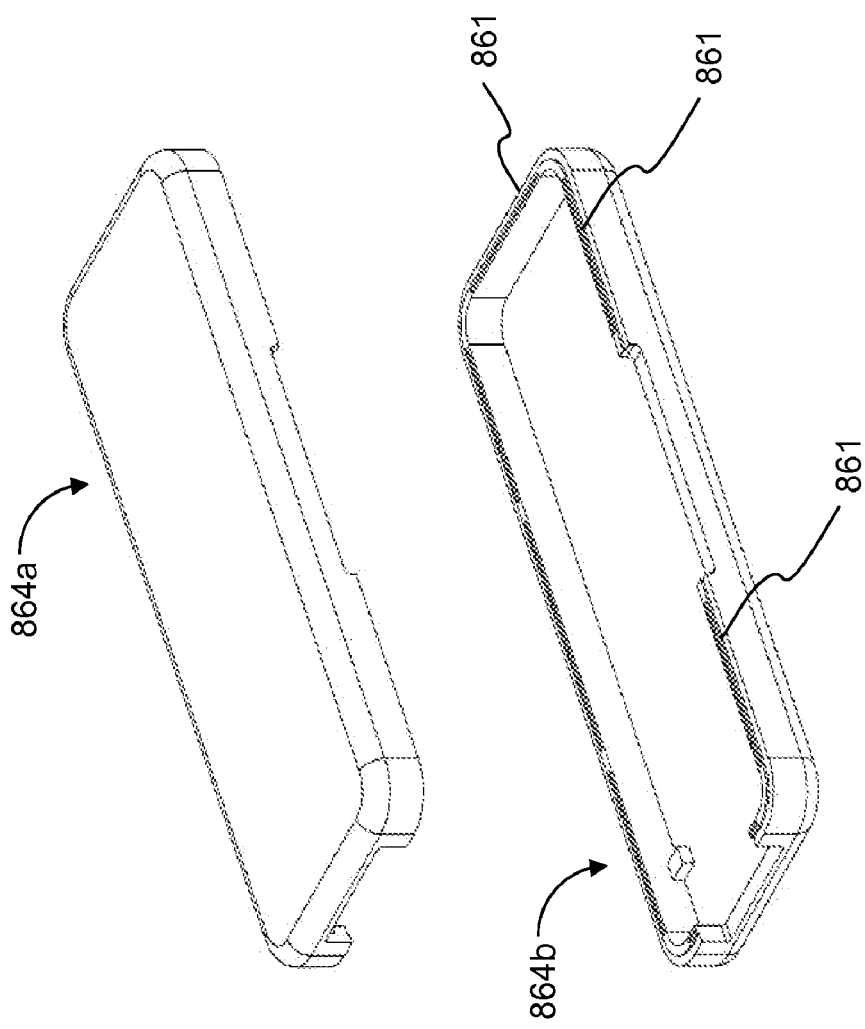

Alternative means for joining top and bottom housings 864*a-b* shown in FIG. 8G. The top and bottom housing 864*a-b* are joined by ultrasonic welding. The materials of the top and bottom housing to use in this process may be made of thermoplastic materials such as Acrylonitrile Butadiene Styrene (ABS), ABS/polycarbonate alloy, polyester, Polyvinyl chloride (PVC), Nylon and Nylon with fiberglass. A plurality of ultrasonic bonders 861 is applied on the flat edges of the side walls of the bottom housing 864*b* to serve as the initial melting point as an ultrasonic wave from welding machine generates high frequency vibration between the ultrasonic bonder 861 and the top housing 864*a*.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the present invention also relate to an apparatus for performing the operations herein. This apparatus may be specially constructed for the required purposes, or it may comprise a general-purpose computer selectively activated or reconfigured by a computer program stored in the computer. Such a computer program may be stored in a computer readable medium. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., carrier waves, infrared signals, digital signals, etc.)), etc.

The algorithms and displays presented herein are not inherently related to any particular computer or other apparatus. Various general-purpose systems may be used with programs in accordance with the teachings herein, or it may prove convenient to construct more specialized apparatus to perform the required method operations. The required structure for a variety of these systems will appear from the description below. In addition, embodiments of the present invention are not described with reference to any particular programming language. It will be appreciated that a variety of programming languages may be used to implement the teachings of embodiments of the invention as described herein.

Although the present invention has been described with reference to specific embodiments thereof, these embodiments are merely illustrative, and not restrictive of, the present invention. Various modifications or changes to the specifically disclosed exemplary embodiments will be suggested to persons skilled in the art. For example, whereas a USB connector has been shown and described, other types of connectors such as a Secure Digital (SD) interface circuit, a Micro SD interface circuit, a Multi Media Card (MMC) interface circuit, a Compact Flash (CF) interface circuit, a Memory Stick (MS) interface circuit, a PCI-Express interface circuit, an Integrated Drive Electronics (IDE) interface circuit, a Serial Advanced technology Attachment (SATA) interface circuit, an external SATA interface circuit, a Radio Frequency Identification (RFID) interface circuit, a fiber channel interface circuit, and an optical connection interface circuit may be used to achieve the same function. Additionally, whereas the size of the data area of a page has been shown to hold four sectors of 512-data, a page holds other number of sectors such as eight may be used. In summary, the scope of the invention should not be restricted to the specific exemplary embodiments disclosed herein, and all modifications that are readily suggested to those of ordinary skill in the art should be included within the spirit and purview of this application and scope of the appended claims.

What is claimed is:

1. A method of managing memory address of a multi-level cell (MLC) based flash memory device comprising:
   receiving, in the MLC based flash memory device, a logical sector address (LSA) along with a data transfer request from a host computing device;
   extracting set, entry, page and sector numbers from the LSA with an indexing scheme;
   loading a set, corresponding to the set number, of partial logical-to-physical address and page usage information (PLTPPUI) into an address correlation page usage memory (ACPUM);
   reading a physical block number of flash memory of the MLC based flash memory device, the physical block number corresponds to the entry number in the ACPUM; and
   when the data transfer request is a read request, reading data from a physical page corresponding to the page number to a page buffer, and sending a requested data sector from the page buffer in accordance with the sector number received from the host computing device;
   when the data transfer request is a write request, writing page buffer contents to a physical page corresponding to the page number if the page buffer contents have been modified, writing a received data sector to the page buffer in accordance with the sector number received from the host computing device and setting corresponding one of a plurality of sector update flags reflecting the data sector just written into the page buffer.

2. The method of claim 1, further comprises writing ACPUM contents to one of a plurality of first physical blocks in a reserved area of the flash memory, if the ACPUM contents have been modified, before loading the set of PLTPPUI into the ACPUM.

3. The method of claim 2, wherein the ACPUM contents are written to, said one of the first physical blocks one page at a time based on a set of MLC data programming rules which includes: (a) writing to a higher page number sequentially in a same one of the first physical blocks, and (b) since each page can only be written once thereby requiring a new blank one of the first physical blocks for writing to an already modified page.

4. The method of claim 3, wherein each of the first physical blocks in the reserved area is referenced by one of a plurality of first special logical addresses and a correlation between the first physical blocks and the first special logical addresses is kept in a PLTPPUI tracking table.

5. The method of claim 4, wherein the PLTPPUI tracking table further contains a tracking number and a highest page number for said each of the first physical blocks, the tracking number is configured for identifying which version of a particular set of PLTPPUI is stored in said each of the first physical blocks and the highest page is configured for tracking which page has been written in said each of the first physical blocks.

6. The method of claim 5, wherein the tracking number associated with particular one of the first special logical addresses are written to spare area of first page of said each of the first physical blocks in the reserved area of the flash memory.

7. The method of claim 6, wherein the PLTPPUI tracking table is rebuilt in each initialization of the MLC flash memory device from stored tracking number and stored first special logical address in the spare area of the first page of said each of the first physical blocks in the reserved area of the flash memory.

8. The method of claim 5, further comprises writing wear leveling counter and bad block indicator (WL/BB) of the flash memory into a plurality of second physical blocks that is referenced by a plurality of second special logical addresses.

9. The method of claim 8, wherein correlation of the second physical blocks and the second special addresses is kept in a WL/BB tracking table.

10. The method of claim 2, wherein the reserved area of the flash memory is defined in an initial manufacturing program by the manufacturer of the MLC based flash memory device.

11. The method of claim 2, further comprises writing the modified page buffer contents and the modified ACPUM contents to the flash memory if the MLC based flash memory device has been idling for more than a predefined period of time.

12. The method of claim 2, further comprises performing background recycling of physical blocks containing stale data.

13. The method of claim 1, wherein the indexing scheme comprises the PLTPPUI and is based on physical characteristics of the flash memory including total number of sets, entries, pages and sectors, and ratios among said sets, said entries, said pages and said sectors.

14. A multi-level cell (MLC) based flash memory device adapted to be accessed by a host computing device comprising:
- an upper housing structure;
- a lower housing structure; and
- a core unit enclosed in between the upper and lower housing structures, wherein the core unit comprises an interface connector and a print circuit board with at least one MLC based flash memory chip and a flash memory controller mounted thereon,
- wherein the flash memory controller is configured for managing memory address of the flash memory device with following operations:
    - receiving, in the MLC based flash memory device, a logical sector address (LSA) along with a data transfer request from a host computing device;
    - extracting set, entry, page and sector numbers from the LSA with an indexing scheme;
    - loading a set, corresponding to the set number, of partial logical-to-physical address and page usage information (PLTPPUI) into an address correlation page usage memory (ACPUM);
    - reading a physical block number of flash memory of the MLC based flash memory device, the physical block number corresponds to the entry number in the ACPUM; and
    - when the data transfer request is a read request, reading data from a physical page corresponding to the page number to a page buffer, and sending a requested data sector from the page buffer in accordance with the sector number received from the host computing device;
    - when the data transfer request is a write request, writing page buffer contents to the physical page corresponding to the page number of if the page buffer contents have been modified, writing a received data sector to the page buffer in accordance with the sector number received from the host computing device and setting corresponding one of a plurality of sector update flags reflecting the data sector just written into the page buffer.

15. The flash memory device of claim 14 further comprises a fingerprint sensor adapted to scan a fingerprint of a user of the flash memory device and to generate fingerprint scan data, wherein the generated fingerprint scan data is compared with fingerprint reference data to authenticate the user.

16. The flash memory device of claim 14 further comprises a layer of conforming coating configured for preventing oxidation of integrated circuit leads or soldering area; covering or protecting extreme temperature exposure either cold or hot; and waterproofing for certain military or industrial applications.

17. The flash memory device of claim 14, wherein said interface connector includes an interface circuit of one of Universal Serial Bus (USB), Secure Digital (SD), Micro SD, Multi-Media Card (MMC), Compact Flash (CF), Memory Stick (MS), PCI-Express, a Integrated Drive Electronics (IDE), Serial Advanced Technology Attachment (SATA), external SATA, Radio Frequency Identification (RFID), fiber channel and optical connection.

* * * * *